US007796426B2

(12) United States Patent
Tonomura et al.

(10) Patent No.: US 7,796,426 B2
(45) Date of Patent: Sep. 14, 2010

(54) SEMICONDUCTOR DEVICE

(75) Inventors: Osamu Tonomura, Kokubunji (JP); Norikatsu Takaura, Tokyo (JP); Kenzo Kurotsuchi, Kodaira (JP); Nozomu Matsuzaki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 323 days.

(21) Appl. No.: 12/090,375

(22) PCT Filed: Oct. 17, 2005

(86) PCT No.: PCT/JP2005/019052

§ 371 (c)(1),
(2), (4) Date: Apr. 16, 2008

(87) PCT Pub. No.: WO2007/046130

PCT Pub. Date: Apr. 26, 2007

(65) Prior Publication Data

US 2009/0231913 A1    Sep. 17, 2009

(51) Int. Cl.
*G11C 11/00*    (2006.01)
(52) U.S. Cl. .................. 365/163; 363/158; 363/171; 363/173
(58) Field of Classification Search .................. 365/163, 365/158, 171, 173
See application file for complete search history.

(56) References Cited

U.S. PATENT DOCUMENTS 7,005,665 B2*   2/2006   Furkay et al. ............... 257/2
7,057,922 B2    6/2006   Fukumoto
7,684,235 B2*   3/2010   Liu ........................... 365/163
2003/0067013 A1   4/2003   Ichihara et al.
2005/0036364 A1   2/2005   Ha et al.
2008/0113464 A1*  5/2008   Savransky .................. 438/48

FOREIGN PATENT DOCUMENTS

JP    2003-100085 A    4/2003
JP    2005-63647 A     3/2005
JP    2005-92912 A     4/2005

OTHER PUBLICATIONS

F. Jiang et al., "The Effect of Doping on the Erasure Speed and Stability of Reversible Phase-Change Optical Recording Films," Japanese Journal of Applied Physics, vol. 30, No. 1, Jan. 1991, pp. 97-100.

* cited by examiner

*Primary Examiner*—Pho Miner Luu
(74) *Attorney, Agent, or Firm*—Miles & Stockbridge P.C.

(57) ABSTRACT

A technique capable of improving speed of a set operation, which controls writing rate in a semiconductor device including a memory cell using a phase-change material. The technique uses means for setting a set-pulse voltage to be applied to the phase-change material to have two steps: the first-step voltage sets a temperature of the phase-change memory to a temperature at which the fastest nucleation is obtained; and the second pulse sets the temperature to a temperature at which the fastest crystal growth is obtained, thereby obtaining solid-phase growth of the phase-change material without melting. Moreover, the technique uses means for controlling the two-step voltage applied to the phase-change memory by a two-step voltage applied to a word line capable of reducing the drain current variation.

19 Claims, 19 Drawing Sheets

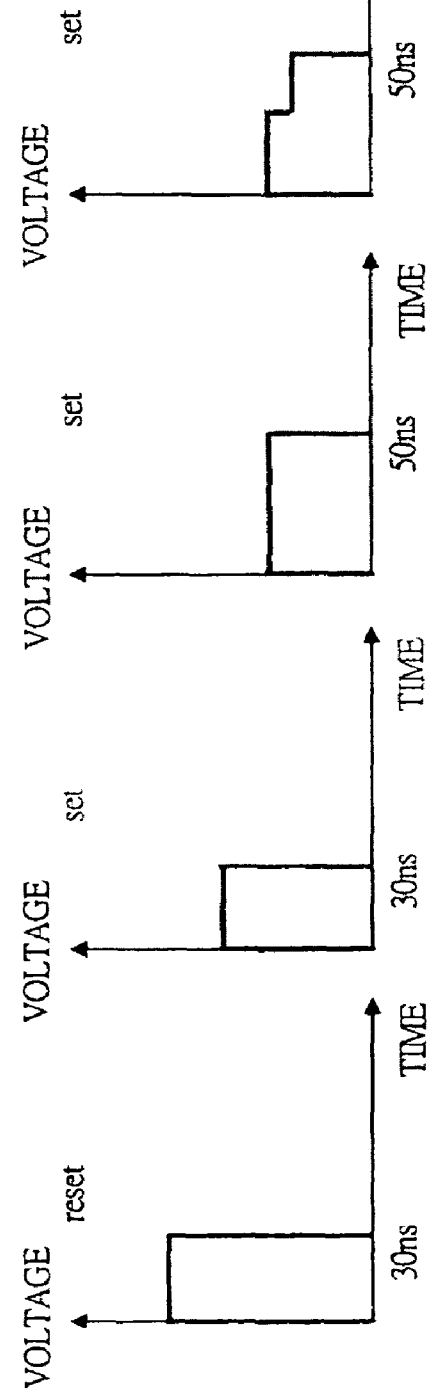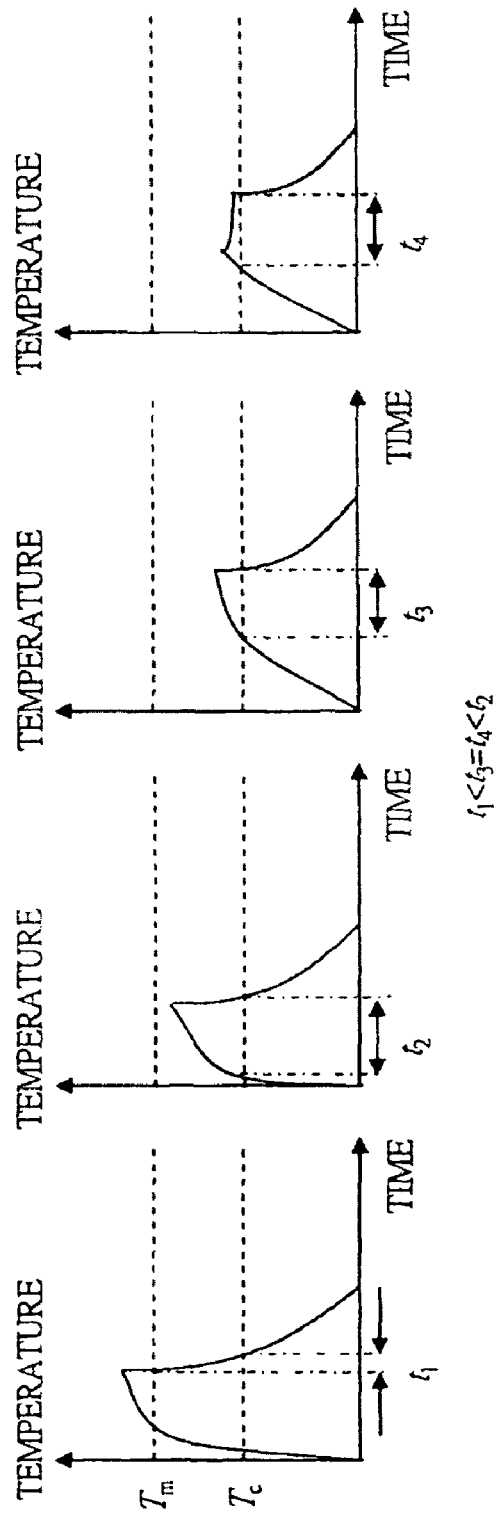

SEMICONDUCTOR DEVICE

TECHNICAL FIELD

The present invention relates to a semiconductor device, and more particularly, the present invention relates to a technology effectively applied to a high-density integrated memory circuit including a memory cell that discriminates storage information by using a difference in resistances, for example, a memory cell using a phase-change material, a logic-mixed memory in which a memory circuit and a logic circuit are provided on a same semiconductor substrate, a semiconductor integrated circuit device having an analog circuit, a non-volatile random access memory, and the like.

BACKGROUND ART

As for a memory using a phase-change material, for example, the following technologies have been studied by the inventors of the present invention.

A phase-change memory which is a memory using a resistor element formed of a phase-change material is also a non-volatile memory in which the phase-change material is crystallized through a set operation and amorphousized through a reset operation, thereby storing information based on a difference in resistance values due to the change of phase state of the phase-change material. Here, the set which is a low resistance state does not necessarily be a completely crystallized state, and the reset which is a high resistance state does not necessarily be a completely amorphosized state, and the state can take an arbitral value between a value in the low resistance state representing the completely crystallized state and a value in the high resistance state representing the completely amorphosized state.

For the reset, a high voltage is applied to increase the temperature of the phase-change material to a temperature equal to or higher than its melting point. In addition, after melting the phase-change material, a short-time pulse which rapidly attenuates is applied in order to prevent crystallization. For the set, the phase-change material is held at a temperature equal to or higher than its crystallization temperature and lower than the melting point. For this reason, a set pulse is lower in voltage and longer in time than the reset pulse.

What the phase-change memory can be applied to is replacement of the FLASH memory which is the mainstream of non-volatile memories. Since the phase-change memory can be operated by a lower voltage and is capable of high-speed rewrite as compared with the FLASH memory, the phase-change memory can be a higher-performance non-volatile memory. And if speed enhancement goes further, a high-speed non-volatile RAM can be achieved. While many of portable devices have both a non-volatile FLASH memory and a DRAM which is a high-speed volatile RAM mounted thereto, if a non-volatile RAM having features of these two memories can be achieved, the FLASH memory and the DRAM can be integrated as one chip, thereby replacing all the semiconductor memories.

Note that, examples of technical documents relating to the present invention include Patent Document 1 and Non-Patent Document 1.

Patent Document 1: Japanese Patent Application Laid-Open Publication No. 2003-100085

Non-Patent Document 1: Japanese Journal of Applied Physics, Vol. 30, January, 1991, pp. 97-100

DISCLOSURE OF THE INVENTION

Meanwhile, as a result of the studies on the above-described technologies for phase-change memory by the inventors of the present invention, the following has been revealed.

For example, in the conventional reset operation of the phase-change memory, a rectangular voltage pulse is applied to increase the temperature of the phase-change material to a temperature equal to or higher than the melting point, and after the phase-change material is once melted, the phase-change material is rapidly cooled down. For example, when the phase-change material is $Ge_2Sb_2Te_5$, and the rectangular reset pulse is applied, since the phase-change material of $Ge_2Sb_2Te_5$ has a time constant in temperature change of about 2 ns (nanoseconds), even if the reset pulse width is 30 ns, the temperature of the phase-change material exceeds its melting point, and then, by rapidly cooling down, a reset operation can be performed.

On the other hand, in a set operation of the conventional method, a rectangular voltage pulse is applied to increase the temperature of the phase-change material to a temperature lower than its melting point and equal to or higher than a crystallization temperature, and the temperature is held for about 1 μs, thereby heating not only the phase-change material but also its surroundings. After the voltage pulse is made at 0V, the phase-change material is slowly cooled down due to the heat of the surrounding within a temperature zone lower than the melting point and equal to or higher than the crystallization temperature, the zone in which crystallization of the phase-change material proceeds, so that phase-change material is crystallized. In such a conventional method, about 1 μs is required to sufficiently heat the temperature of the surrounding of the phase-change material, and therefore the set operation requires a time of about 1 μs.

In this manner, in the conventional method, a write time of the phase-change memory is rate-controlled by the set operation.

The above and other objects and novel characteristics of the present invention will be apparent from the description of this specification and the accompanying drawings.

The typical ones of the inventions disclosed in this application will be briefly described as follows.

That is, a semiconductor device according to the present invention has a function of applying a voltage pulse by which the phase-change material reaches a temperature equal to or higher than its melting point by the application as a voltage pulse to be applied in a set operation so that the temperature of the phase-change material is rapidly increased, and stopping the application of the voltage pulse before the temperature reaches the melting point.

Further, the semiconductor device according to the present invention has a function of applying two-step set voltages to be applied to the phase-change material, and after applying a first voltage, a second voltage lower than the first voltage is applied.

The effects obtained by typical aspects of the present invention will be briefly described below.

It is possible to increase the rewrite speed of a memory cell element using a phase-change material, for which a high-speed set operation is required.

BRIEF DESCRIPTIONS OF THE DRAWINGS

FIGS. 19A to 19H are diagrams showing relations between a pulse waveform and a change in temperature of the phase-change material according to the second embodiment of the present invention;

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 3:
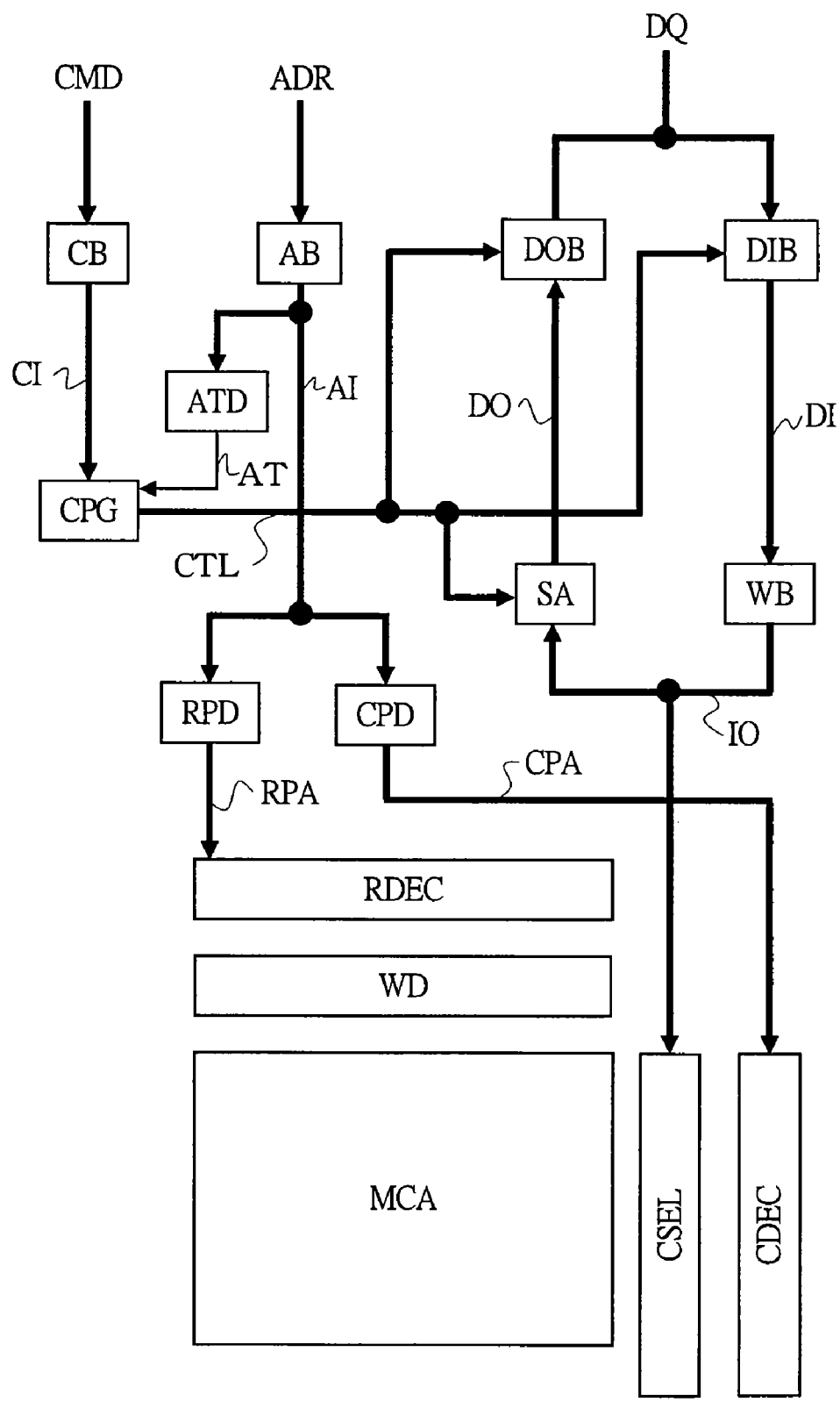
FIG. 3 is a block a diagram showing a configuration of the phase-change memory according to the first embodiment of the present invention.

FIG. 3 is a block diagram of main parts of an asynchronous phase-change memory according to a first embodiment of the present invention.

First, with reference to FIG. 3, an example of the configuration of the asynchronous phase-change memory according to the first embodiment will be described. In the asynchronous phase-change memory, although not limited to this, the operation is performed according to a state of a control signal and also a detection of an address transition. The asynchronous phase-change memory according to the first embodiment includes: for example, a command buffer CB; a control-signal generation circuit CPG; an address buffer AB; an address-transition detection circuit ATD; a row predecoder RPD; a column predecoder CPD; an input buffer DIB; an output buffer DOB; a sense amplifier block SA; and a write buffer block WB. Furthermore, corresponding to a memory cell array MCA, for example, a row decoder RDEC, a word-line driver WD, a column decoder CDEC, and a column selector CSEL are provided. Here, although only one memory cell array MCA is shown, a plurality of memory cell arrays MCA may be provided corresponding to the memory cell capacity.

Respective circuit blocks function as follows. The control-signal generation circuit CPG generates a control signal CTL for controlling, for example, the input buffer DIB, the output buffer DOB, the sense amplifier block SA, and the write buffer block WB according to an external control signal CMD taken in by the command buffer CB. The address buffer AB fetches an address ADR from the external, and sends an internal address AI to the address-transition detection circuit ATD, the row predecoder RPD, and the column predecoder CPD. The address-transition detection circuit ATD detects a transition of the internal address AI, and outputs an address transition signal AT to the control-signal generation circuit CPG. Specifically, a logic for detecting a change in each bit of the address is taken, and a logical disjunction is performed to generate the address transition signal AT.

The row predecoder RPD predecodes a row address, and outputs a row predecode address RPA to the row decoder RDEC. The row decoder RDEC further decodes the row predecode address RPA and, in response, the word-line driver WD selectively drives a word line in the memory cell array MCA. The column predecoder CPD predecodes a column address, and outputs a column predecode address CPA to the column decoder CDEC. The column decoder CDEC further decodes the column decode address CPA and, in response, the column selector CSEL selectively connects a bit line in the memory cell array MCA to an input/output line IO.

The input buffer DIB fetches input/output data DQ from/to the external at desired timing, and sends the input data DI to the write buffer block WB. According to the input data DI, the write buffer block WB drives the input/output line IO for a write operation. The sense amplifier block SA includes sense amplifiers the number of which is in accordance with the number of bits to be operated at the same time, and amplifies a signal on the input/output line IO to discriminate for a read operation, and outputs read data DO. The output buffer DOB outputs the read data DO to the input/output data DQ at desired timing.

Figure 4:
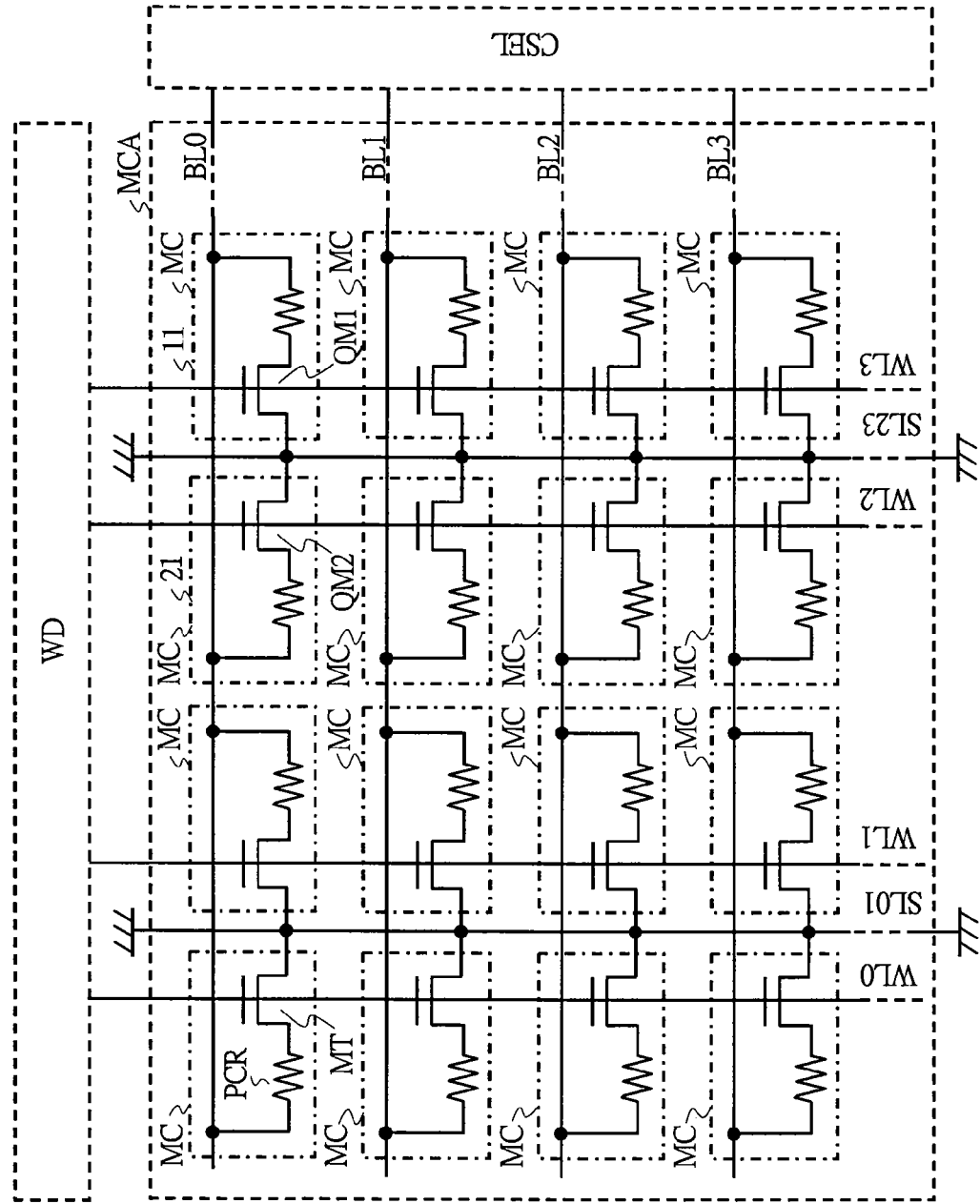
FIG. 4 is a circuit diagram showing a configuration of a memory cell array according to the first embodiment of the present invention.

FIG. 4 shows a configuration example of the memory cell array MCA. Memory cells MC are provided at cross points of word lines WL0, WL1, WL2, WL3, . . . connected to the word-line driver WD and bit lines BL0, BL1, BL2, BL3, . . . connected to the column selector CSEL. Also, source lines SL01, SL23, . . . are provided and connected to a ground voltage VSS. Each memory cell MC is configured of a phase-change resistor PCR and a memory cell transistor MT. The phase-change resistor PCR has one end connected to a bit line and the other end connected to one of the source and drain of the memory cell transistor MT. The phase-change resistor is formed of, for example, a chalcogenide material containing Te and the like. The other of the source and drain of the memory cell transistor is connected to a source line, and the gate is connected to a word line. In FIG. 4, while the memory cell transistor MT, a MIS (Metal Insulator Semiconductor) type transistor is used, a bipolar transistor may also be used.

Here, although not shown for the sake of brevity, a dummy cell for generating a reference signal at the time of reading is also provided as required. Also, although an NMOS transistor is used as the memory cell transistor herein, a PMOS transistor or a bipolar transistor can be used. However, in view of higher integration, a MOS transistor is preferable. More preferably, an NMOS transistor having a small channel resistance in an ON state is suitable compared with a PMOS transistor. In the following, operation and others are described with a voltage relation in the case of using an NMOS transistor as the memory cell transistor.

Figure 5:
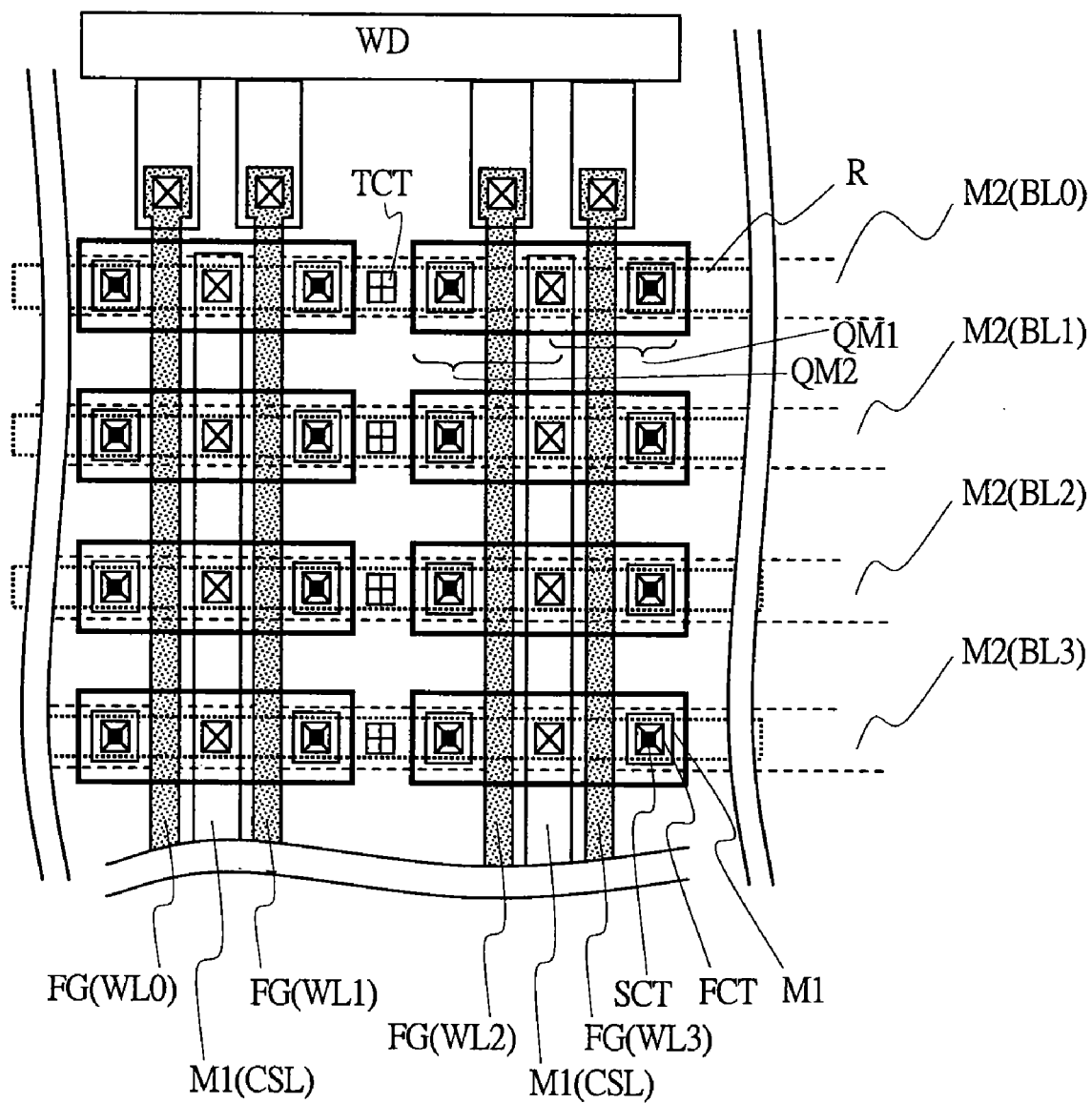
FIG. 5 is a layout diagram showing a configuration of the memory cell array according to the first embodiment of the present invention.

FIG. 5 shows a layout corresponding to the configuration of the memory cell array of FIG. 4. Various circuitry elements shown in FIG. 4 are provided with the same reference symbols. In FIG. 5, areas partitioned by heavy black lines are areas corresponding to the memory arrays MCA shown in FIG. 4. In FIG. 5, M1 represents a first metal layer, M2 represents a second metal layer, FG represents a layer for use as a gate electrode of a transistor formed on a silicon substrate, FCT represents a contact hole connecting an upper surface of FL and the lower surface of M1, R represents a multilayered film of a storage element PCR and its upper electrode layer UE, SCT represents a contact hole connecting an upper surface of M1 and a lower surface of R, and TCT represents a contact hole connecting the upper surface of M1 and a lower surface of M2. The storage element R is drawn up to the second metal layer M2 between memory cells connected to the same bit line via the contact hole TCT. This second metal layer M2 is used as respective bit lines. The word lines WL0 and WL3 are formed of FG. For FG, a multilayer of polysilicon and silicide (an alloy of silicon and a high-melting-point metal) is used, for example. One MOS transistor configuring the memory cell MC11 is represented by QM1. A transistor QM2 configuring the memory cell MC21 shares a source area with the transistor QM1. As shown in the drawing, the same goes for the MOS transistors configuring other cells.

Figure 6:
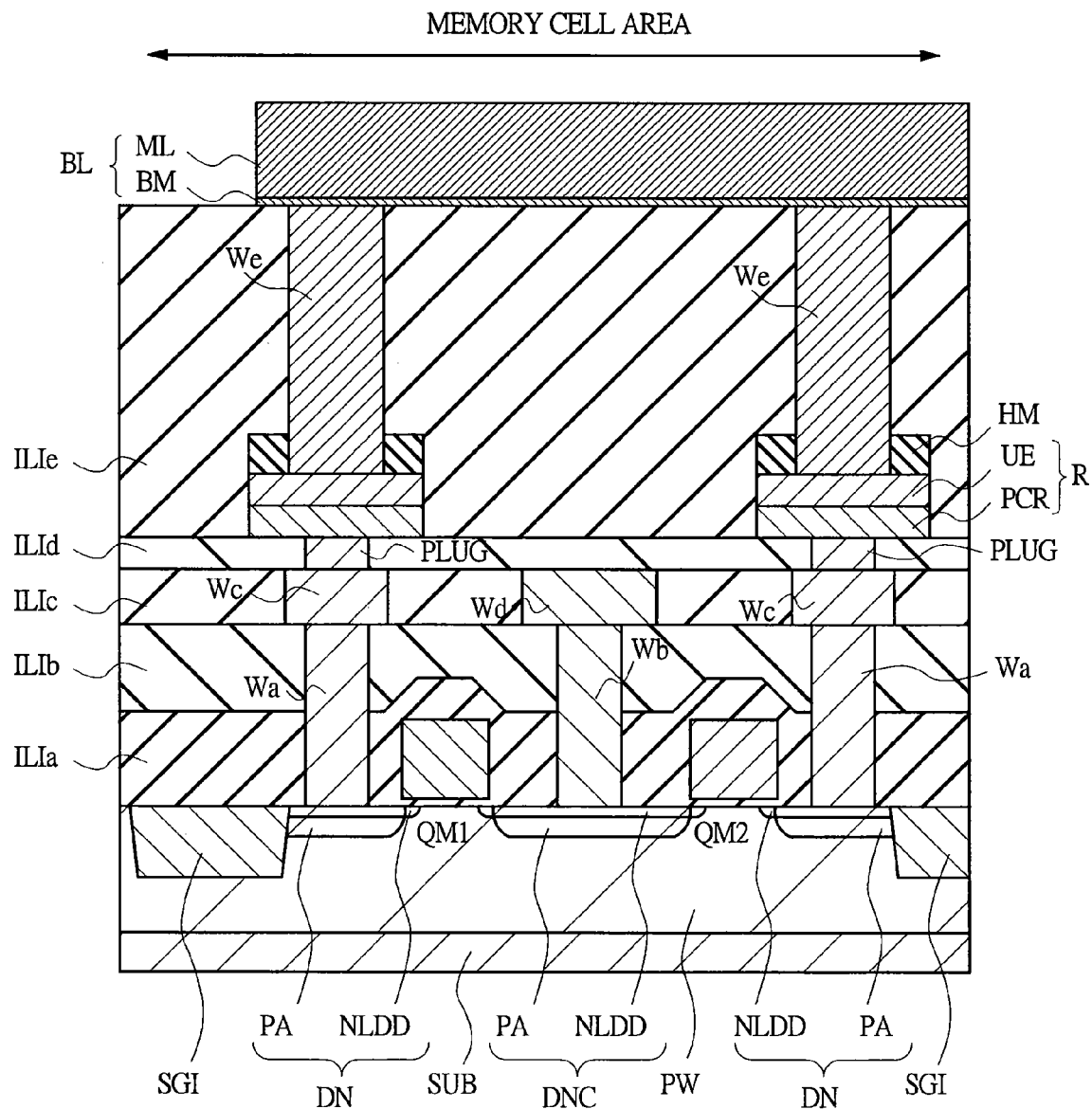
FIG. 6 is a cross-sectional view showing a configuration of the memory cell according to the first embodiment of the present invention.

FIG. 6 is a cross-sectional view of main parts of the memory cell array. This example shows a specific configuration example for achieving the array configuration shown in FIG. 5. FIG. 6 is a cross-sectional view showing a logic-mixed memory, a logic circuit area, and a memory cell area of the phase-change memory cell. On a well PW formed on a semiconductor substrate SUB, desired transistors QM1 and QM2 and others are formed. A first layer wiring M1, a source line wiring, and others are routed at a position of an interlayer insulating film ILIc.

Then, on the top, in the memory cell area, the phase-change material PCR is formed via a lower electrode plug PLUG, thereby forming main parts configuring the memory cells. Then, this memory cell portion is connected to a bit line BL via a plug-shaped metal contact We arranged thereon.

In the memory cell area, for example, n-channel-type MOS transistors QM1 and QM2 for memory cell selection are formed. The n-channel-type MOS transistors QM1 and QM2 for memory cell selection are formed on an upper portion of a p-well PW so as to be separated from each other. These transistors have semiconductor areas DN and DNC having an LDD (Lightly Doped Drain) structure, a gate insulating film formed on the semiconductor substrate, and a gate electrode formed on the gate insulating film. The semiconductor area DNC is shared between adjacent n-channel-type MOS transistors for memory cell selection in the same active device region.

These n-channel-type MOS transistors QM1 and QM2 for memory cell selection are covered by interlayer insulating films ILIa and ILIb deposited on the semiconductor substrate SUB.

These interlayer insulating films ILIa and ILIb are formed of, for example, a silicon dioxide film, through a common technique such as plasma CVD. The interlayer insulating film ILIb has an upper surface planarized so that the height of the memory area and the height of the logic circuit area substantially coincide with each other.

In the interlayer insulating films ILIa and ILIb in the memory cell area, connection holes are bored so that the upper surfaces of the semiconductor areas DN and DNC of the MOS transistors QM1 and QM2 for memory cell selection are exposed.

In these connection holes, conductive materials Wa and Wb made of, for example, tungsten are buried to form contact electrodes. And, when tungsten is used as the conductive material, for example, TiN on the order of 10 nm is present between the interlayer insulating films ILIa and ILIb as a barrier metal layer.

These contact electrodes are electrically connected to the semiconductor areas DN and DNC of the MOS transistors QM1 and QM2 for memory cell selection.

In an interlayer insulating film ILIc in the memory cell area, connection holes are bored so that contact electrodes made of conductive materials Wc and Wd made of, for example, tungsten, are exposed. And, when tungsten is used as the conductive material, for example, TiN on the order of 10 nm is present between the contact electrodes and the interlayer insulating film ILIc as a barrier metal layer. The contact electrodes are electrically connected to the semiconductor area DNC shared between the n-channel-type MOS transistors QM1 and QM2 for memory cell selection.

On an upper surface of the interlayer insulating film ILIc, an interlayer insulating film ILId is deposited. This interlayer insulating film ILId is made of silicon dioxide, for example.

In the interlayer insulating film ILId in the memory cell area, connection holes are bored so that the source line wiring SL is exposed. In these connection holes, a conductive material PLUG made of, for example, tungsten, is buried to form contact electrodes. And, when tungsten is used as the conductive material, for example, TiN on the order of 10 nm is present between the contact electrodes and the interlayer insulating film ILId as a barrier metal layer. The contact electrodes are electrically connected to the source line wiring SL.

In an interlayer insulating film ILIe in the memory cell area, resistor elements R to serve as memory elements are formed in a stripe shape and configured of the phase-change material PCR and an upper electrode UE applied on a surface of the phase-change material PCR and made of, for example, tungsten. Examples of the phase-change material PCR configuring the resistor element R include, for example, a Ge—Sb—Te-based phase-change material, a Zn—Te-based phase-change material, or, these materials added with a doped element as an X—Ge—Sb—Te-based phase-change material with a doped element X, or a Y—Zn—Te-base phase-change material with a dopant Y. Examples of the doped element X include In, Cr, O, N, Zn, Bi, Ag, Au, and Se, etc. Examples of the doped element Y include Sb, In, Cr, O, N, Ge, Bi, Ag, Au, and Se, etc.

Examples of the material to be used for the lower electrode plug PLUG of the phase-change memory include W, TiN, TiW, TiAlN, and polysilicon, and the like.

A lower portion of the resistor element R is electrically connected to a lower contact electrode of the memory cell, and electrically connected to the semiconductor area DN of the n-channel-type MOS transistors QM1 and QM2 for memory cell selection.

On an upper surface of the resistor element R, a hard mask insulating film HM is deposited. This hard mask insulating film HM is made of silicon dioxide, for example. The hard mask insulating film HM is deposited for patterning the resistor element R, and formed in a stripe shape.

In the interlayer insulating film ILIe and the hard mask insulating film HM in the memory cell area, connection holes are bored so that the upper surface of the upper electrode UE is exposed. In these connection holes, a metal film We made of, for example, tungsten, is buried to form upper electrode contacts of the memory cell. And, when tungsten is used as the conductive material, for example, TiN on the order of 10 nm is present between the electrode contact and the interlayer insulating film ILIe as a barrier metal layer.

The upper electrode contacts of the memory cell are electrically connected to the upper surface of the resistor elements R, and through which the memory cell upper electrode contacts are electrically connected to the semiconductor areas DN of the n-channel-type MOS transistors QM1 and QM2 for memory cell selection.

On an upper surface of the interlayer insulating film ILIe, the bit lines BL are formed. These bit lines are formed by depositing a metal layer ML made of aluminum. These bit lines BL are electrically connected to bit line contacts made of, for example, a barrier metal BM and tungsten We and further electrically connected to the resistor elements R through the bit line contacts.

Figure 7:
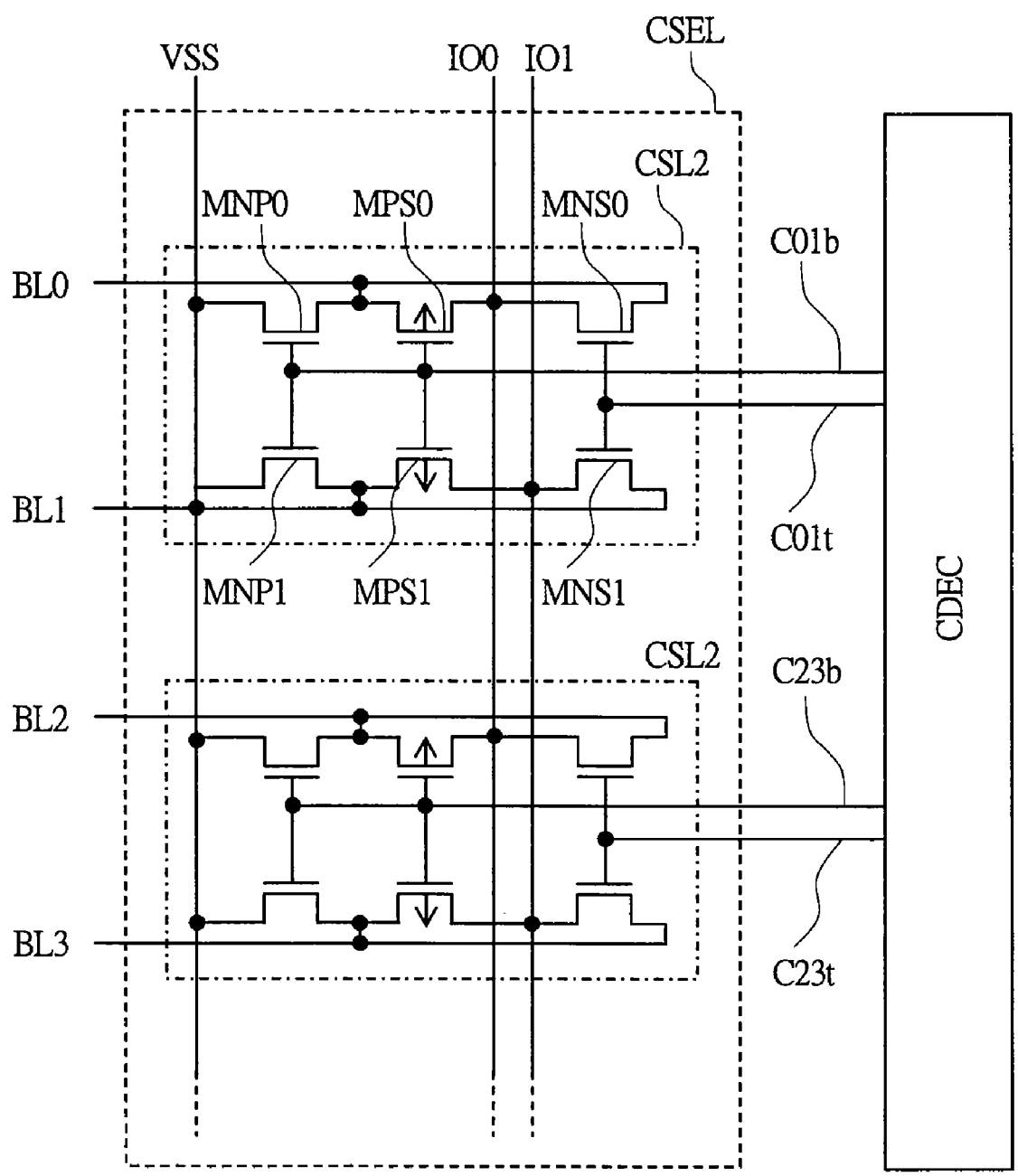
FIG. 7 is a circuit diagram showing a configuration of a column selector according to the first embodiment of the present invention.

FIG. 7 shows a configuration example of the column selector CSEL in FIG. 3. This is an example where every two bits of the memory cells are selected from the memory cell array for operation. This configuration can be similarly achieved even with a different number of memory cells selected at the same time. For every two bit lines, a column switch CSL2 is provided and controlled with column selection signals outputted from the column decoder CDEC so that every two bit lines are connected to input/output lines IO0 and IO1. The column selection signals are complementary to each other, such as C01b and C01t, C23b and C23t, .... The column switch CSL2 includes four NMOS transistors MNP0, MNP1, MNS0 and MNS1, and two PMOS transistors MPS0 and MPS1. These NMOS transistors MNP0 and MNP1 hold a non-selected bit line at the ground voltage VSS. The NMOS transistors MNS0 and MNS1 and the PMOS transistors MPS0 and MPS1 configure two CMOS pass gates, and connect the selected bit lines to the input/output lines IO0 and IO1. In this manner, with the use of CMOS pass gates, the bit lines and the input/output lines can be connected to each other with low resistance in a wide voltage range. Consequently, the range of the voltage applied to the bit line can be widened, thereby ensuring a margin when a switching is made between low resistance and high resistance for a read operation and a write operation based on a value of the current flowing through the phase-change resistance.

Figure 8:
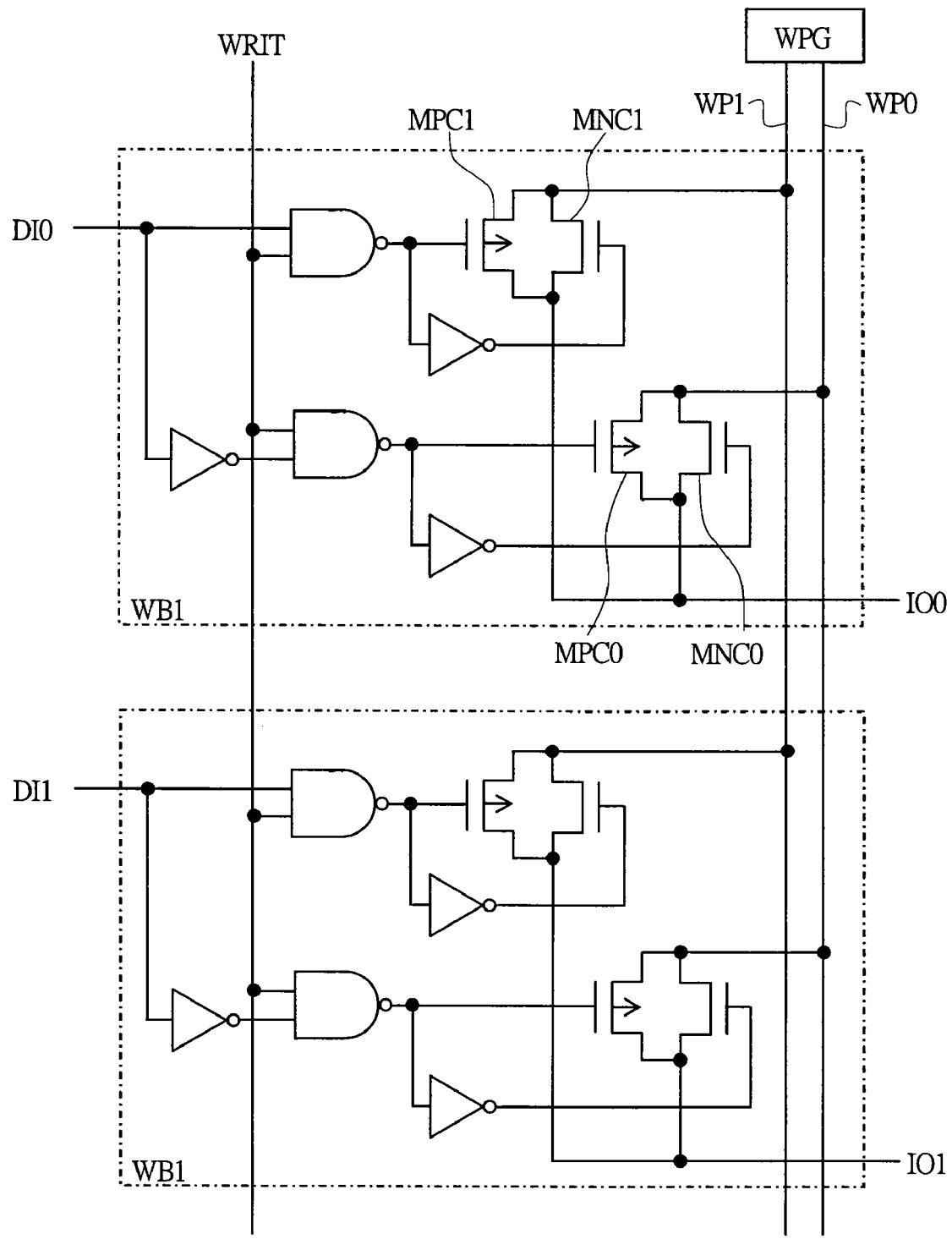
FIG. 8 is a circuit diagram of a configuration of a write buffer block according to the first embodiment of the present invention.

FIG. 8 shows a configuration example of the write buffer block WB in FIG. 3. The write buffer block WB includes a write-pulse generation circuit WPG and two write buffers WB1. This is also an example where writing is made to two memory cells in the memory cell array at the same time. If the write buffers WB1 are provided according to the number of memory cells in which writing is made at the same time, it is possible to support other numbers of memory cells. The write-pulse generation circuit WPG generates pulses for making low resistance and high resistance and outputs them to write pulse lines WP0 and WP1, respectively. The write buffer WB1 is configured of two CMOS pass gates each including three inverters, two two-input NAND gates, two NMOS transistors MNC0 and MNC1, and two PMOS transistors MPC0 and MPC1. The write buffers WB1 are activated by a write control signal WRIT, and connects the input/output lines IO0 and IO1 to write pulse lines WP0 and WP1 according to the write data DI0 and DI1, respectively. Here, by using the CMOS pass gates, with the write pulse generation circuit WPG, it is possible to drive to the ground voltage at the falling edge of the input/output lines IO0 and IO1. This prevents the electric charge in a parasitic capacitance of the input/output lines from being discharged through the bit lines and the memory cells, thereby steepening the falling edges of the pulse waveform of the bit line current and achieving a stable write operation.

Figure 9:
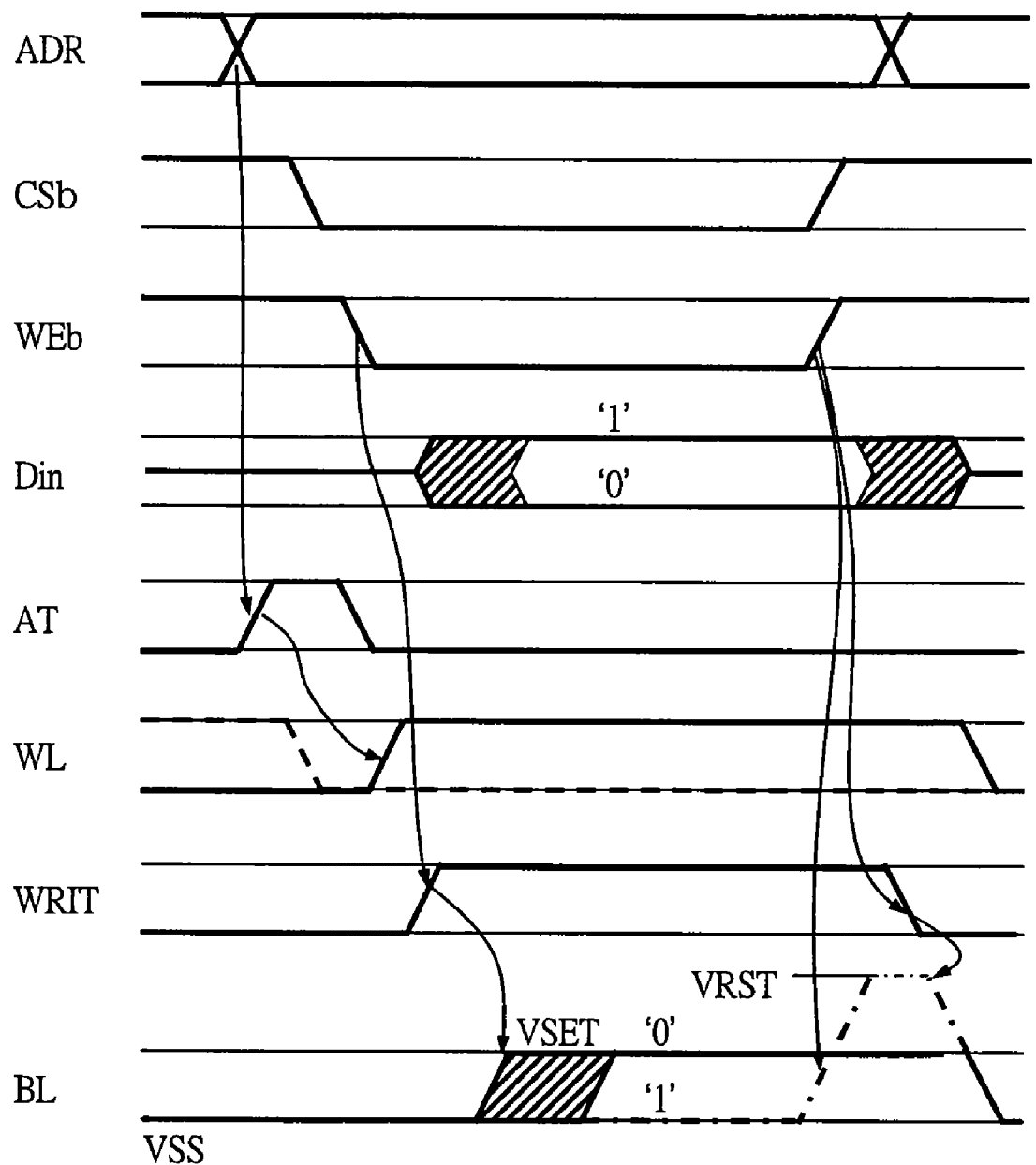
FIG. 9 is a timing chart of a write operation according to the first embodiment of the present invention.

Next, the above-described operation of the asynchronous phase-change memory will be described. FIG. 9 shows an example of timing of a write operation. According to the transition of the external address ADR, the address transition circuit ATD generates a pulse at the address transition signal AT, thereby switching the word lines WL (WL0, WL1, WL2, WL3, ... in FIG. 4). As a chip select bar signal CSb and a write enable bar signal WEb that are parts of the control signal CMD become a LOW level, the write control signal WRIT becomes "1", thereby causing a write operation to be performed. According to an input Din to the input/output data DQ, the selected bit line BL (BL0, BL1, BL2, BL3, ... in FIG. 4) is driven. Here, if the input Din is "0", the bit line BL is driven to a set voltage VSET. If the input Din is "1", the bit line BL is kept at the ground voltage VSS. Also, if the input Din is "1", the bit line BL is driven to a reset voltage VRST. To achieve the pulse for making high resistance with a desired pulse width, the write control signal WRIT becomes "0" to return the bit line BL to the ground voltage VSS, thereby terminating the write operation. While the description has been made as if Din is one bit here, in the case of plural bits, an operation corresponding to data is performed for each bit. Other operation timings will be also described below in a simplified manner similar to the above.

In general asynchronous SRAM specifications, when the period of the write operation ends, it is determined that the input Din is valid. In the operation of FIG. 7, if the input Din is "0", the bit line is just driven to ensure a period for making low resistance. On the other hand, if the input Din is "1", after it is determined that the input Din is valid, the bit line is driven, thereby shortening the pulse width for driving the bit line. This prevents an unnecessary increase of the temperature of the surroundings of the phase-change resistor of the select memory cell and expansion of the cooling time. As a result, a stable write operation can be achieved for both "0" and "1". And, by limiting the pulse width for making high resistance, an unnecessary write current is prevented from flowing, thereby achieving a write operation with low power consumption.

Figure 10:
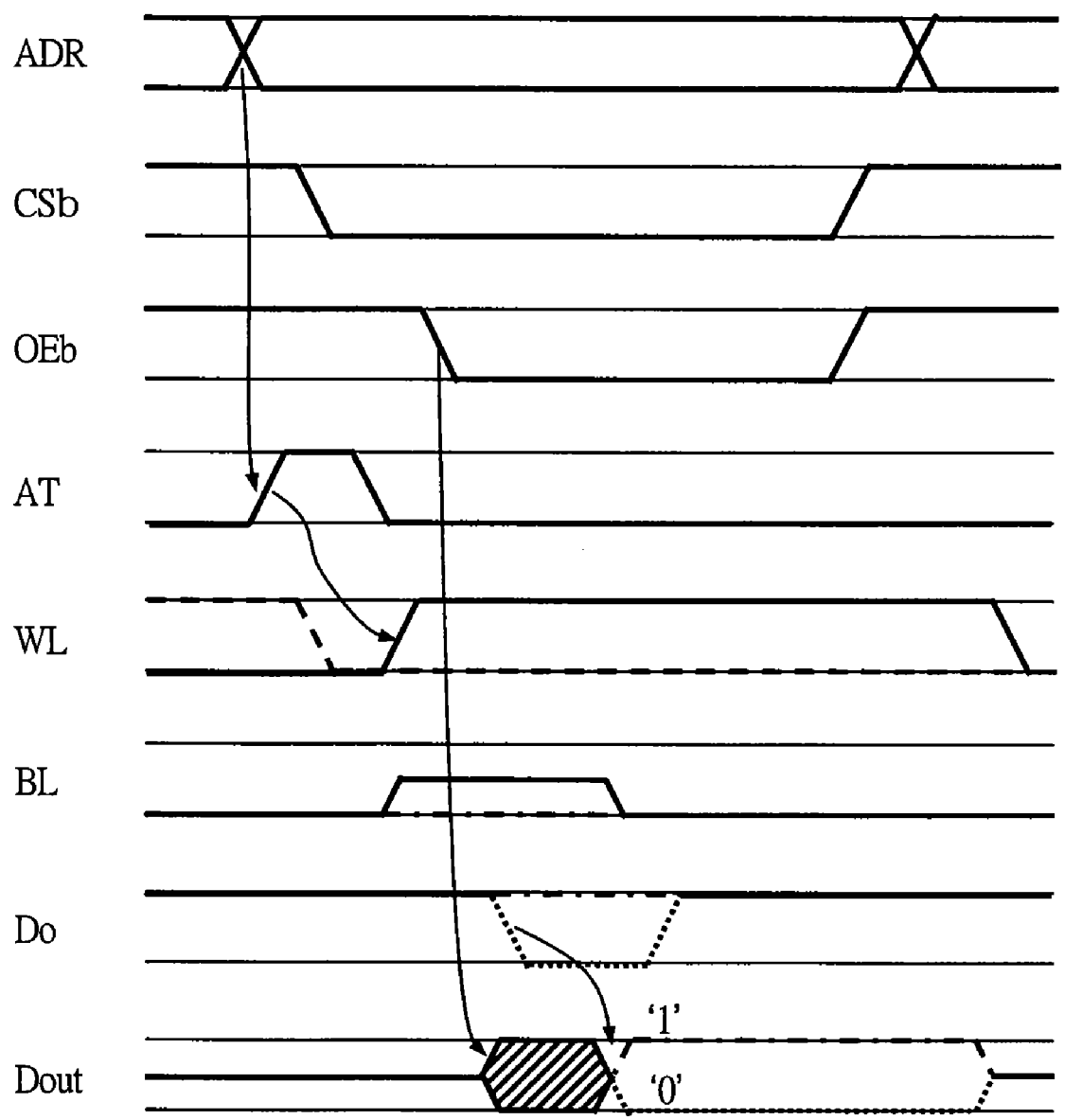
FIG. 10 is a timing chart of a read operation according to the first embodiment of the present invention.

FIG. 10 shows an example of timing of a read operation. As with the write operation shown in FIG. 9, according to the transition of the external address ADR, the word line WL is switched. As the chip select bar signal CSb and an output enable bar signal OEb that are parts of the control signal CMD become a LOW level, the output buffer is activated, and the input/output data DQ is driven to the output Dout corresponding to read data Do. As either one of the chip select bar signal CSb and the output enable bar signal OEb become a HIGH level, the period of the read operation terminates, and the output buffer DOB becomes a high impedance state.

The voltage pulse applied upon rewriting the phase-change memory is applied as a voltage of the upper electrode UE to the lower electrode plug PLUG or a voltage of the lower electrode plug PLUG to the upper electrode UE. When a potential difference occurs between the upper electrode UE and the lower electrode plug PLUG, a current flows through the phase-change material PCR, thereby generating Joule heat in the lower electrode plug PLUG and the phase-change material PCR having high resistance. This Joule heat induces a phase change of the phase-change material PCR, thereby rewriting the phase-change memory.

Figure 1A:
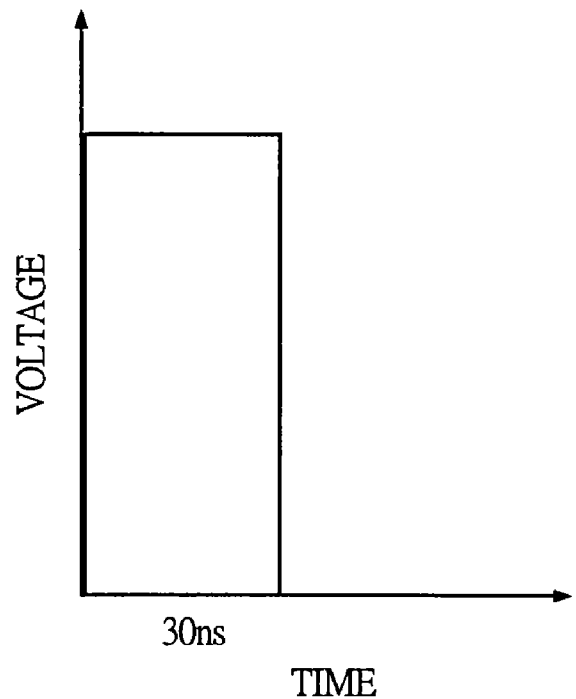
FIGS. 1A and 1B are diagrams showing a waveform of a pulse voltage according to first and second embodiments of the present invention.
Figure 1B:
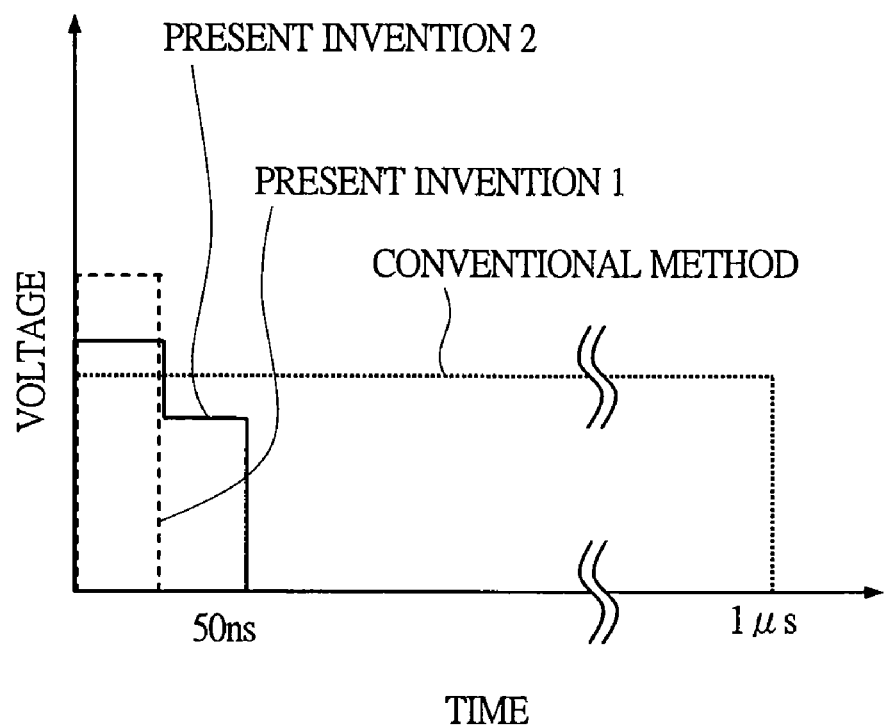
Figure 2A:
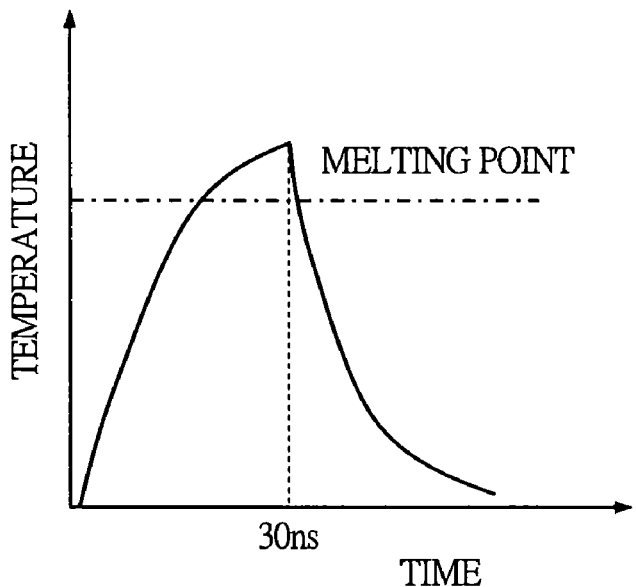
FIGS. 2A and 2B are diagrams showing changes in temperature of a phase-change material.
Figure 2B:
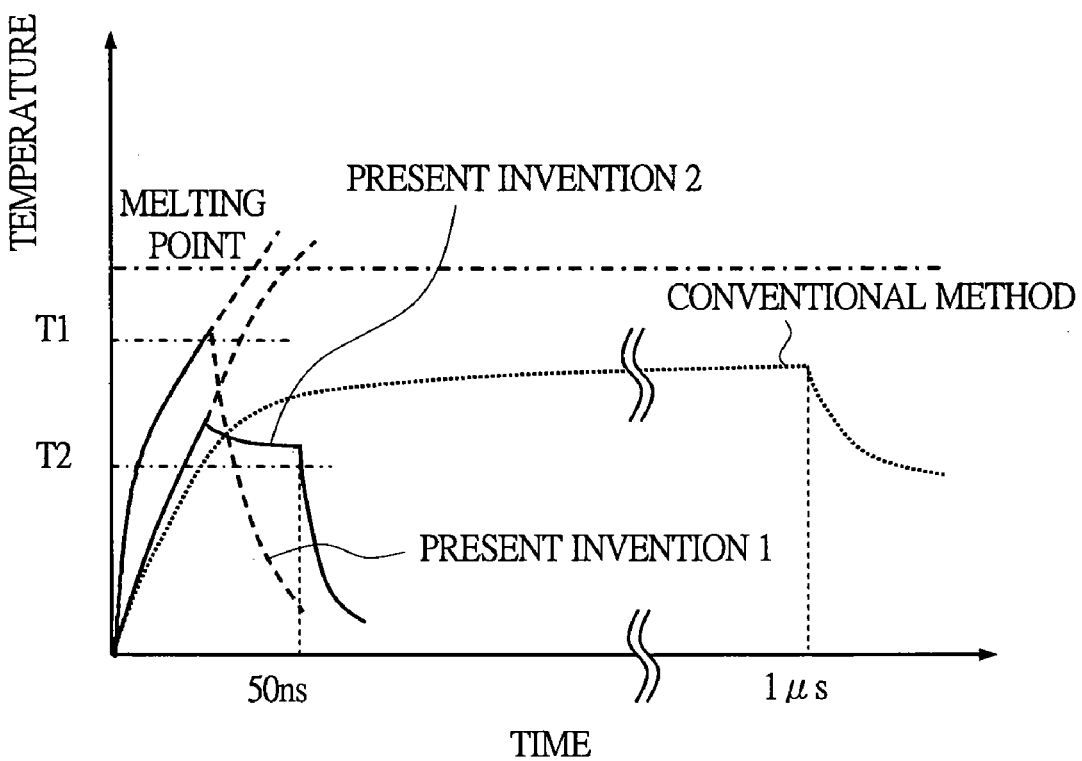

FIGS. 1A and 1B are diagrams showing waveforms of a pulse voltage applied to the phase-change material PCR, and FIG. 1A shows a reset operation and FIG. 1B shows a set operation. FIGS. 2A and 2B are diagrams showing changes in temperature of the phase-change material PCR, and FIG. 2A shows a reset operation and FIG. 2B shows a set operation, respectively. And, in FIGS. 1B and 2B, "present invention 1" points a waveform of the present first embodiment, and "present invention 2" points a waveform of the second embodiment which will be described further below. And, for easy understanding of the features of the present invention, a waveform in a conventional method studied as a premise of the present invention is also shown.

To reset the phase-change memory, a rectangular pulse as shown in FIG. 1A is applied. By applying the pulse, the temperature is increased to a temperature equal to or higher than the melting point so that the phase-change material PCR is once melted, and then rapidly cooled. As an example, a change in temperature when $Ge_2Sb_2Te_5$ is used as the phase-change material PCR is now described. Since a time constant of change in temperature of $Ge_2Sb_2Te_5$ is about 2 ns, if a sufficiently high voltage pulse is applied, the temperature of the phase-change material PCR exceeds the melting point by a time equal to or less than 30 ns, as shown in FIG. 2A. Next, when the voltage pulse is back to 0V, the material is rapidly cooled. As a result, the reset operation can be sufficiently performed within a time equal to or less than 30 ns.

To set the phase-change memory, a rectangular voltage pulse as indicated by "present invention 1" as shown in FIG. 1B is applied. When this voltage is applied, by the voltage application indicated by "present invention 1" as shown in FIG. 2B, the temperature of the phase-change material PCR is rapidly increased, and when the voltage is applied for a sufficiently long time, the temperature reaches a temperature equal to or higher than the melting point. However, before reaching the melting point, the material is cooled by making the pulse voltage to 0V. In the case where the present method is used and the phase-change material PCR is $Ge_2Sb_2Te_5$, in a period from the time point when the temperature exceeds 160° C. at which crystallization begins to the time point when the temperature goes below 160° C. by cooling, it is put in a temperature zone in which crystallization of the phase-change material PCR is accelerated, that is, in a temperature zone from the crystallization temperature 160° C. or higher to the melting point below 600° C. And thus, crystallization proceeds in that period. If the temperature of the phase-change material PCR goes to equal to or higher than the melting point by the application of the voltage pulse, the phase-change material PCR is amorphosized. Thus, crystallization begins from the time point when the temperature goes below the melting point. This is disadvantageous in view of speed improvement. By using the present method, high-speed crystallization of the phase-change material PCR is achieved.

Second Embodiment

Figure 11:
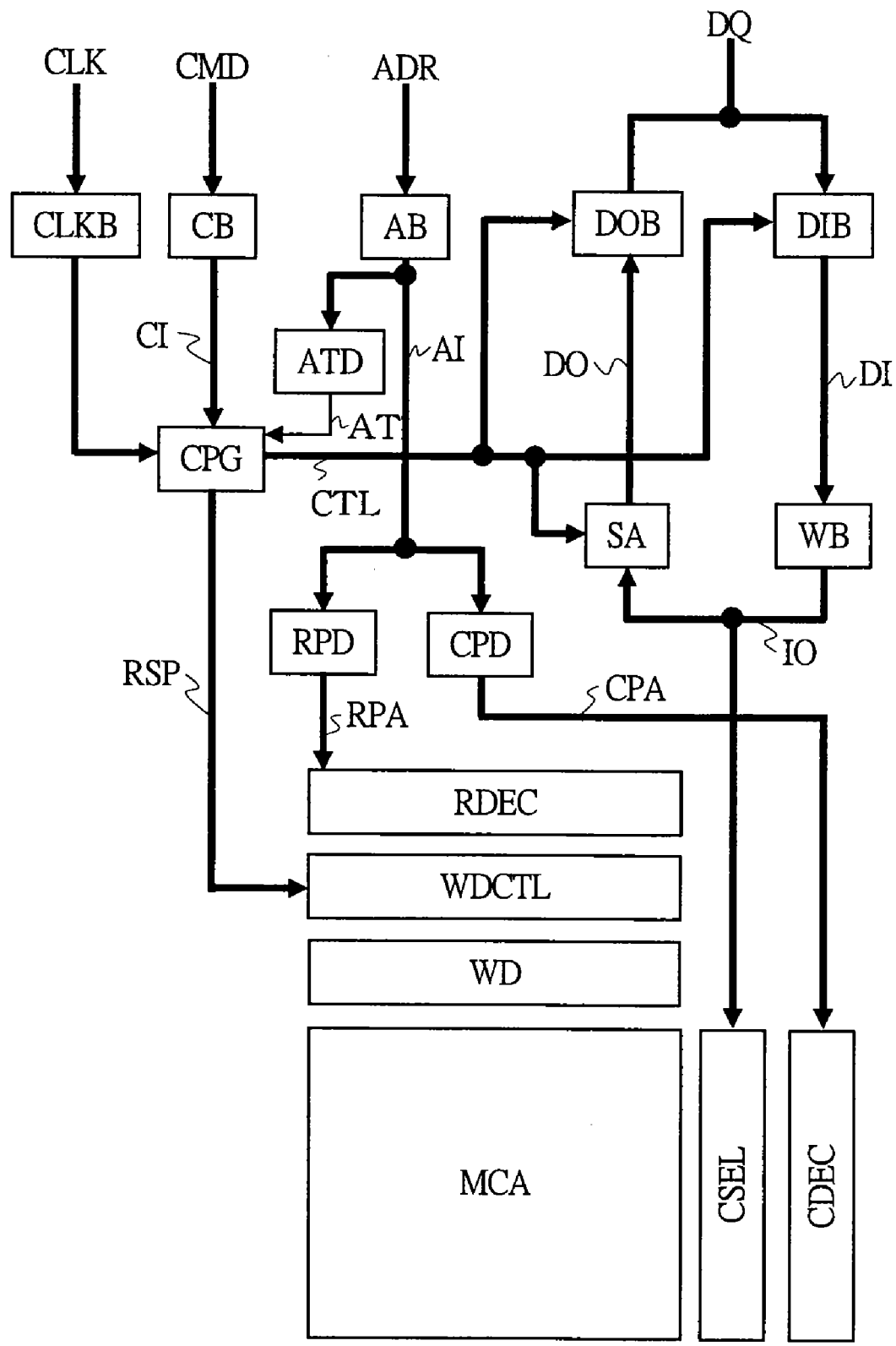
FIG. 11 is a block diagram showing a configuration of a phase-change memory according to the second embodiment of the present invention.

FIG. 11 is a block diagram showing main parts of a configuration example of an asynchronous phase-change memory according to a second embodiment of the present invention. The memory array circuit, the memory array configuration, the cross-section configuration of the memory cell, the configuration of the column selector CSEL, the write buffer block WB, write timing, and read timing described in the first embodiment with reference to FIGS. 4 to 10 are similarly applied hereto, and therefore descriptions thereof will be omitted. While the configuration is almost the same as that shown in the block diagram of FIG. 3 described in the first embodiment, a circuit to apply a two-step voltage to the word line is additionally incorporated. A signal from an external clock buffer CLKB to which a signal from an external clock CLK has been inputted is inputted to the control-signal generation circuit CPG, and a row set pulse RSP is generated, which is inputted to a word-line control circuit WDCTL.

Figure 12:
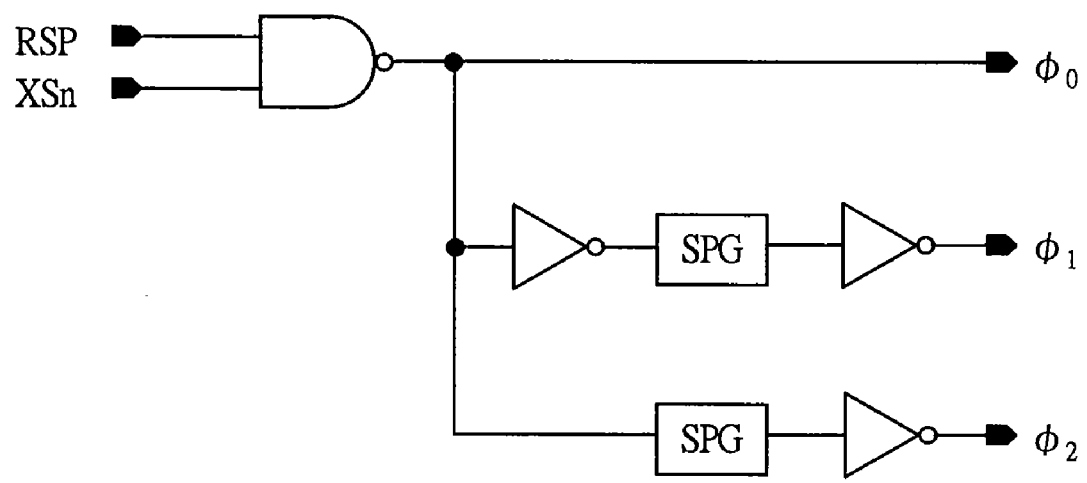
FIG. 12 is a circuit diagram showing a configuration of a word-line control circuit according to the second embodiment of the present invention.
Figure 13:
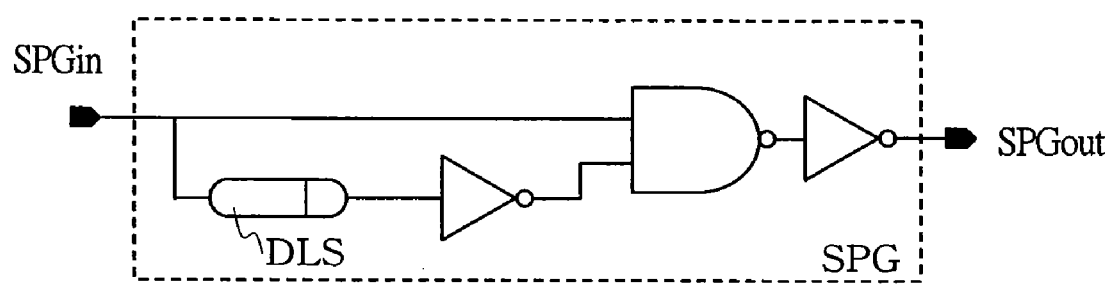
FIG. 13 is a circuit diagram showing a configuration of a short-pulse generation circuit according to the second embodiment of the present invention.
Figure 14:
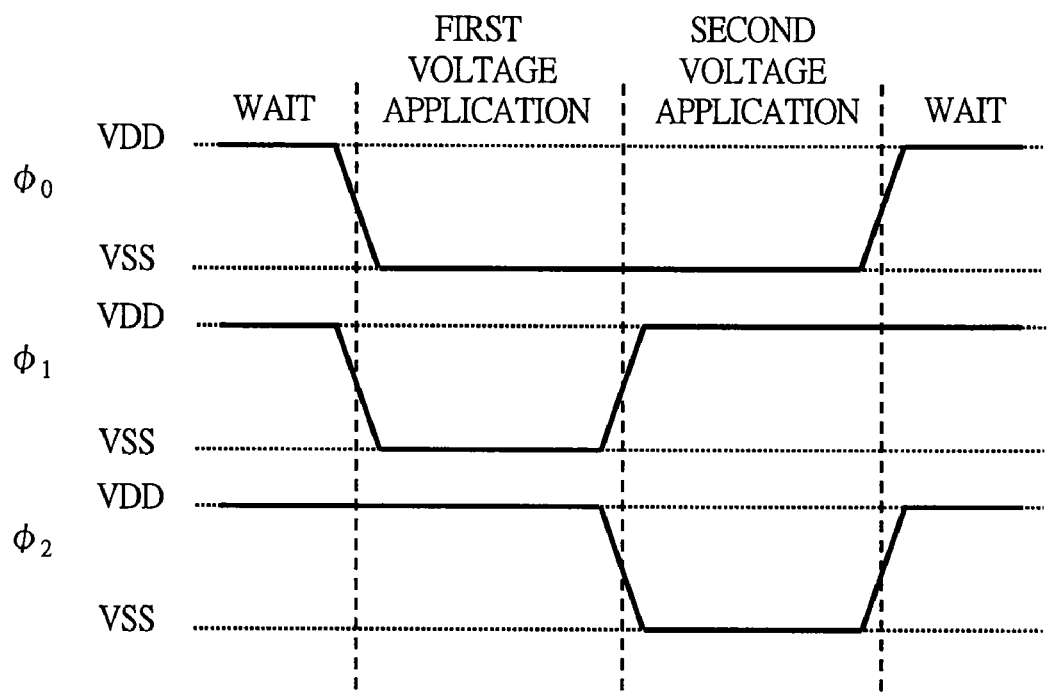
FIG. 14 is a timing chart of a two-step pulse control signal according to the second embodiment of the present invention.
Figure 15:
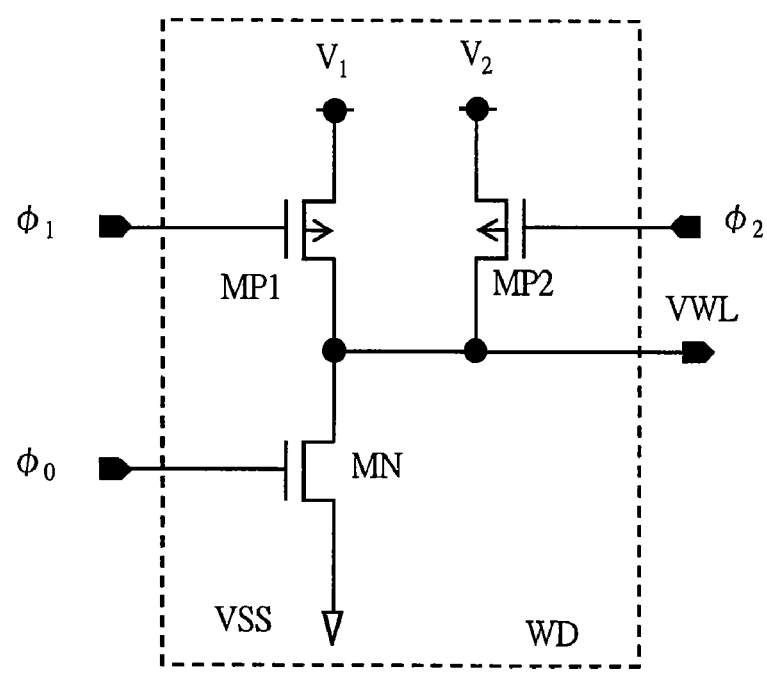
FIG. 15 is a circuit diagram showing a configuration of a word-line driver capable of generating a two-step pulse according to the second embodiment of the present invention.

FIG. 12 is a diagram showing a part of the word-line control circuit WDCTL shown in FIG. 11. FIG. 13 is a diagram showing a configuration example of a short-pulse generation circuit SPG shown in FIG. 12. FIG. 14 is a waveform diagram showing waveforms of two-step-pulse control signals $\phi_1$, $\phi_2$, $\phi_3$ shown in FIG. 12. FIG. 15 is a diagram showing a configuration example of the word-line driver WD capable of generating a two-step pulse.

The circuit shown in FIG. 12 is connected to each word-line driver WD shown in FIG. 15, and therefore is made as many as the number of word-line drivers. In the word-line control circuit WDCTL, upon receiving the row set pulse RSP, a pulse inputted to an input SPGin of the short-pulse generation circuit shown in FIG. 13 is processed by using the short-pulse generation circuit SPG and others including a delay circuit DLS and others. Then, from an output SPGout of the short-pulse generation circuit, pulse waveforms of $\phi_1$, $\phi_2$, $\phi_3$ as shown in FIG. 14 are outputted. These pulses are inputted to the word-line driver WD shown in FIG. 15, and a two-step pulse is generated.

While the above-described circuits can apply a two-step voltage to the word line, if the circuits of FIGS. 12, 13, and 15 are applied to the bit-line driver, a two-step voltage can also be applied to also the bit line.

A pulse waveform (present invention 2) to be used in the set of the present second embodiment is shown in FIG. 1B. And changes in temperature at this time (present invention 2) is shown in FIG. 2B. The set pulse waveform according to the present second embodiment is a two-step pulse using two levels of voltage. Compared with the present first embodiment, advantages in using the two-step pulse can be described as follows. In the method described in the present first embodiment, since the applied voltage is high, the temperature increase speed is extremely rapid, and therefore a time margin for stopping the pulse application is small. That is, if the resistance of the phase-change material PCR is varied to low, the time constant of temperature change is decreased, thereby increasing the temperature increasing speed of the phase-change material. As a result, with the set pulse time described in the first embodiment, the temperature may possibly exceed the melting point. On the other hand, in the method of the two-step pulse that allows using a set pulse of lower voltage, even when the time constant of temperature change of the phase-change material PCR is changed, the possibility of erroneous reset by which the temperature exceeds the melting temperature is small.

Figure 16:
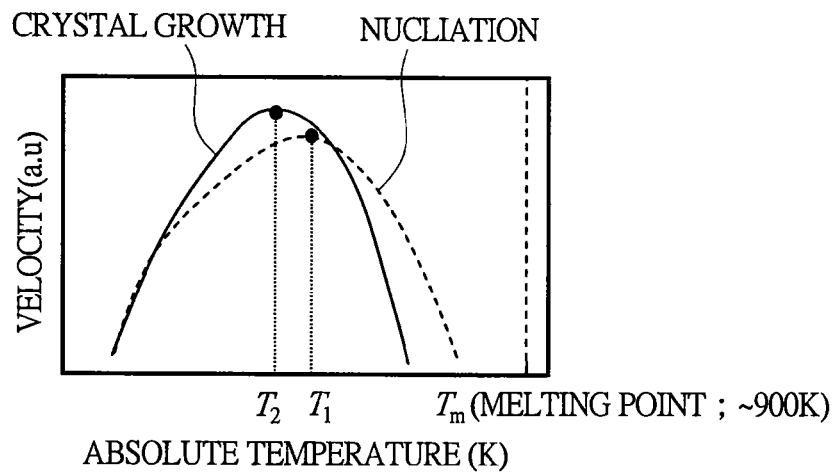
FIG. 16 is a diagram showing a temperature dependence of a crystallization velocity of the phase-change material according to the second embodiment of the present invention.

FIG. 16 is a diagram showing a temperature dependence of a crystallization velocity of the phase-change material PCR.

According to Non-Patent Document 1, the process of crystallization of the phase-change material PCR can be divided into the first half as nucleation and the second half as crystal growth. And in each of these processes, temperature dependence of a crystallization velocity as shown in FIG. 16 is present. In nucleation, a temperature $T_1$ at which the nucleation velocity is maximized is present, and the nucleation velocity is decreased at any temperature at, below, and above the temperature $T_1$. The reason for the decrease of the nucleation velocity at a temperature at or above the temperature $T_1$ is that free energy in a crystalline state is decreased with respect to free energy in an amorphous state. The reason for the decrease of the nucleation velocity at a temperature at or below the temperature $T_1$ is that a diffusion coefficient of atoms constituting the phase-change material are abruptly decreased with temperature.

And, in crystal growth, a temperature $T_2$ at which the nucleation velocity is maximized is present, which is lower than the temperature $T_1$, and a crystallization velocity is decreased at any temperature at, below, and above the temperature $T_2$. The mechanism for that is same as the temperature dependence of nucleation velocity. That is, to maximize the crystallization velocity, as shown in FIG. 2B, the temperature of the phase-change material should be at $T_1$ in the first half in crystallization and at $T_2$ in the second half in crystallization.

Figure 17:
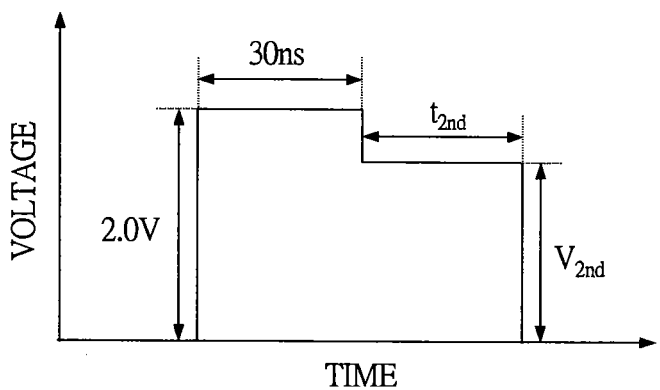
FIG. 17 is a diagram showing a two-step pulse waveform used in an experiment according to the second embodiment of the present invention.
Figure 18:
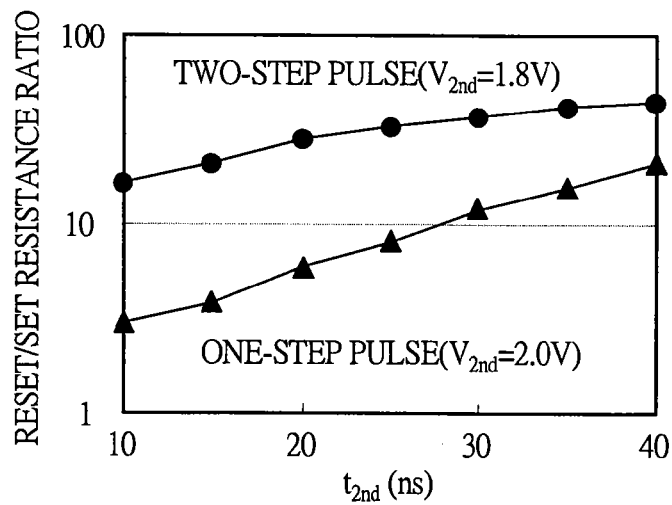
FIG. 18 is a diagram showing experiment results as to a resistance ratio of set/reset by a two-step pulse according to the second embodiment of the present invention.

To demonstrate that speed improvement is possible by the use of the two-step pulse for setting, a principle experiment has been performed, in which a set resistance was examined by applying set pulses of various shapes to the phase-change material PCR in a reset state. The applied set pulses are shown in FIG. 17. As a first voltage, a voltage of 2.0V making the phase-change material PCR be at a temperature allowing the maximum nucleation velocity is applied for 30 ns. Subsequently, as a second voltage, a voltage of $V_{2nd}$V is applied for $t_{2nd}$ ns. For $V_{2nd}$, 2.0V that is a rectangular pulse as the first voltage and 1.8V that makes the phase-change material PCR be at a temperature allowing the maximum crystal growth velocity were selected, and for each pulse, $t_{2nd}$ was varied from 40 ns to 10 ns by 5 ns interval. In the application of these pulses, the temperature of the phase-change material PCR does not exceed the melting point. With respect to the reset resistance, a set resistance after these set pulses were applied has been measured to find a ratio of the reset resistance to the set resistance. The results are shown in FIG. 18.

When $V_{2nd}$ is 2.0V, as $t_{2nd}$ is shortened, crystallization of the phase-change material PCR becomes insufficient, thereby increasing the set resistance. To read written information at high speed, the ratio between the set resistance and the reset resistance is preferably one digit or more. To satisfy the desired value of the resistance ratio, from the results shown in FIG. 18, 30 ns or more is required for $t_{2nd}$. That is, a set time by the rectangular pulse is a sum of the application time of 30 ns of the first voltage and the application time of 30 ns of the second voltage, that is, 60 ns.

On the other hand, when $V_{2nd}$ is 1.8V, compared with the case where $V_{2nd}$ is 2.0V, the resistance value takes a large value even with the same $t_{2nd}$. This is because, by having $V_{2nd}$ 1.8V, the temperature of the phase-change material PCR is changed from the temperature allowing the maximum nucleation velocity to the temperature allowing the maximum crystal-growth velocity, thereby causing crystallization to proceed in a shorter time compared with the case where $V_{2nd}$ is 2.0V. As a result, in the case where $V_{2nd}$ is 1.8V, the minimum $t_{2nd}$ that satisfies the desired value of the resistance ratio is 10 ns. That is, by the use of the two-step pulse, the set time is 40 ns, that is, a sum of the first-voltage application time of 30 ns and the second-voltage application time of 10 ns.

Consequently, it has been demonstrated through the experiment that the velocity can be increased by using the two-step pulse for setting, compared with the one-step pulse.

FIGS. 19A to 19H show changes in temperature of the phase-change material PCR depending on the pulse waves. In FIGS. 19A to 19H, FIGS. 19A to 19D show pulse waves, and FIGS. 19E to 19H show changes in temperature, where FIGS. 19A and 19E, FIGS. 19B and 19F, FIGS. 19C and 19G, FIGS. 19D and 19H correspond to each other. Tm represents a melting temperature (melting point), and Tc represents a crystallization temperature. When the phase-change material has a temperature equal to or higher than Tc and lower than Tm, crystallization proceeds. In FIGS. 19E, 19F, 19G, and 19H, time periods during which the temperature of the phase-change material is equal to or higher than Tc and equal to or lower than Tm by applying each pulse are represented as $t_1$, $t_2$, $t_3$, and $t_4$, respectively. Here, the time periods $t_1$, $t_2$, $t_3$, and $t_4$, have a relational expression of $t_1 < t_3 = t_4 < t_2$.

FIG. 19A shows a reset pulse having a pulse width of 30 ns. Since the applied voltage is large as compared with the set pulse, the temperature increase speed is large as shown in FIG. 19E, and therefore the temperature exceeds the melting point Tm immediately after the application of the reset pulse. After the application of the reset pulse, the temperature is rapidly decreased. However, since the time $t_1$ during which the temperature is equal to or higher than Tc and equal to or lower than Tm is very short, crystallization hardly proceeds. As a result, resetting of the phase-change material PCR is completed.

FIG. 19B shows a set pulse having a pulse width of 30 ns. This corresponds to the setting method described in the first embodiment above. With the application of a pulse voltage higher than the normal set voltage, the temperature of the phase-change material is increased as shown in FIG. 19F. Since the pulse voltage is high, the temperature can become Tm or higher if maintain the application. Meanwhile, before the temperature exceeds Tm, the application of the pulse is stopped. Then, the temperature of the phase-change material is decreased. As a result, in the time period $t_2$ during which the temperature of the phase-change material is in the temperature zone from Tc or higher and Tm or lower, the temperature does not exceed Tm as shown in FIG. 19F. Therefore, as compared with the case of FIG. 19A, the time period $t_2$ is ensured longer, and crystallization thus proceeds.

FIG. 19C shows a set pulse corresponding to a one-step pulse described in FIG. 18. The voltage takes a value making the temperature of the phase-change material allow the fastest nucleation. Compared with the case of FIG. 19B, the pulse voltage is low. Therefore, as for the changes in temperature shown in FIG. 19G, the temperature is rising milder as compared with the case of FIG. 19F. As a result, the time at which the temperature exceeds Tc delays, and though the pulse width is 50 ns, that is, longer than 30 ns in the case of FIG. 19B, the time period $t_3$ during which the temperature is in the temperature zone from Tc or higher to Tm or lower is shorter than $t_2$. As a result, crystallization does not sufficiently proceed.

FIG. 19D shows a set pulse corresponding to the two-step pulse described in FIG. 18. This corresponds to the setting method described in the present second embodiment. The temperature rising by the application of a pulse at the first step shown in FIG. 19H is same to that in FIG. 19G. As a result, the phase-change material becomes a temperature at which the nucleation velocity becomes maximum. Next, the voltage is switched to the second voltage that is lower than the first voltage and at which the crystal growth of the phase-change material proceeds at the maximum velocity. As a result, nucleation and crystal growth in the course of crystallization are rapidly performed. While the time period $t_4$ during which the temperature is in a temperature zone from Tc or higher to Tm or lower is substantially equal to $t_3$ shown in FIG. 19G, crystallization is sufficiently made.

Figure 20:
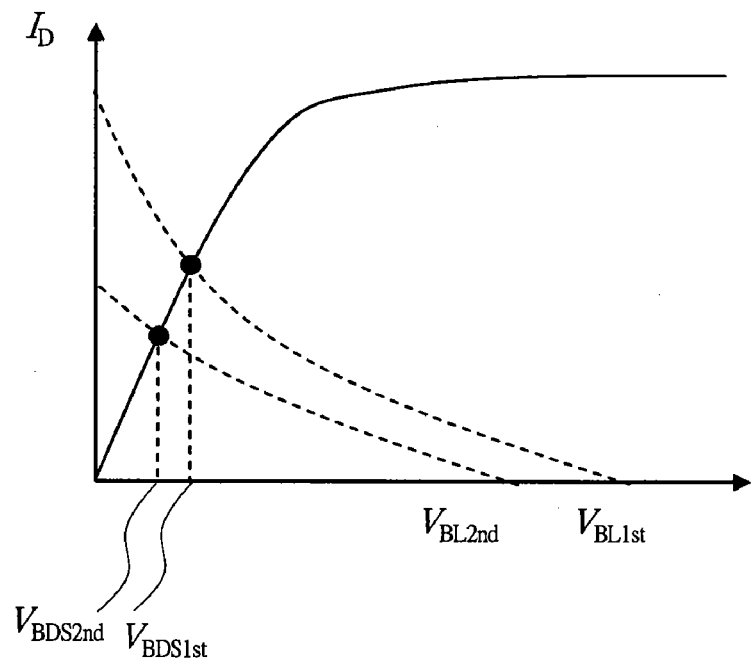
FIG. 20 is a diagram showing a transistor characteristic curve upon application of a two-step pulse to a bit line according to a third embodiment of the present invention.
Figure 21:
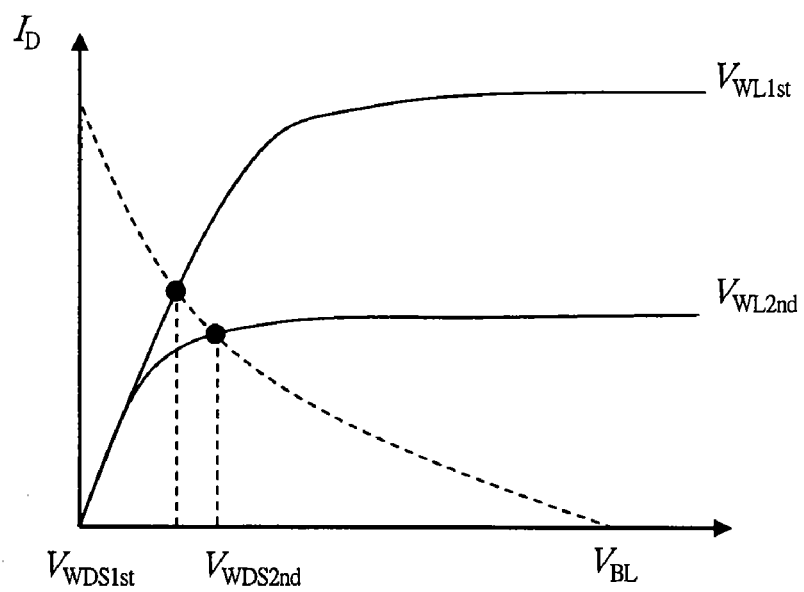
FIG. 21 is a diagram showing a transistor characteristic curve upon application of a two-step pulse to a word line according to the third embodiment of the present invention.

FIG. 20 is a diagram showing a transistor characteristic curve when a two-step pulse is applied to the bit line, and FIG. 21 is a diagram showing a transistor characteristic curve when a two-step pulse is applied to the word line.

The two-step pulse applied to the phase-change material in the present second embodiment is formed by applying a two-step pulse to the bit line BL or the word line WL. When phase-change material PCR is made of $Ge_2Sb_2Te_5$, for example, a current-voltage characteristic is non-ohmic, as shown in load curves of a transistor shown in FIGS. 20 and 21. Such a non-ohmic feature is that a differential resistance is decreased as the voltage applied to the phase-change material PCR is increased. Described below is a study on Joule heat generated in the phase-change material PCR based on the changes in resistance of the phase-change material and the changes in voltage applied to the phase-change material when a two-step pulse is applied to the bit line BL or word line WL based on this mechanism.

When the two-step pulse is applied to the bit line BL, when a first voltage $V_{BL1st}$ applied to the bit line is decreased to a second voltage $V_{BL2nd}$ applied to the bit line as shown in FIG. 20, the voltage applied to the selective transistor is decreased from a first voltage $V_{BDS1st}$ between the source and drain at the time of applying the bit-line two-step pulse to a second voltage $V_{BDS2nd}$ between the source and drain at the time of applying the bit-line two-step pulse. The two load curves have a relation in which one is shifted from another in a horizontal direction. In consideration of the characteristic of non-ohmic property, it can be found from $R_{PCR}(V_{BDS2nd}) - R_{PCR}(V_{BDS1st}) > 0$ that a change in resistance of the phase-change material PCR is increased. And, a change in voltage applied to the phase-change material PCR is such that $(V_{BL2nd} - V_{BDS2nd}) - (V_{BL1st} - V_{BDS1st}) < 0$, that is, the voltage is decreased. Joule heat E generated in the phase-change material PCR can be represented by $E = V^2/R$. When the bit-line BL voltage is changed from the first voltage to the second voltage, the resistance of the phase-change material PCR is increased, and the voltage applied to the phase-change material PCR is decreased. Therefore, an amount of change $\Delta E_{BL}$ of the Joule heat E generated in the phase-change material PCR at the time of the application of the bit-line two-step pulse is always $\Delta E_{BL} < 0$. This is suitable for causing a change in temperature from the nucleation temperature to the crystallization temperature lower than the nucleation temperature.

Next, the case of applying the two-step pulse to a word line WL is considered with reference to FIG. 21. When the voltage applied to the word line is decreased from a first voltage $V_{WL1st}$ applied to the word line to a second voltage $V_{WL2nd}$ applied to the word line, the voltage to be applied to the selective transistor is increased from a first voltage $V_{WDS1st}$ between the source and drain at the time of the two-step pulse application to the word-line to a second voltage $V_{WDS2nd}$ between the source and drain at the time of application of the two-step pulse to the word-line. As a result, due to the characteristics of non-ohmic property described above, it can be found from $R_{PCR}(V_{WDS2nd}) - R_{PCR}(V_{WDS1st}) > 0$ that a change in resistance of the phase-change material is increased. And, a change in voltage applied to the phase-change material is such that $(V_{BL} - V_{WDS2nd}) - (V_{BL} - V_{WDS1st}) = V_{WDS1st} - V_{WDS2nd} < 0$, that is, the voltage is decreased. In other words, when the word-line WL voltage is changed from the first voltage to the second voltage, the resistance of the phase-change material PCR is increased, and the voltage applied to the phase-change material PCR is decreased. Therefore, an amount of change $\Delta E_{WL}$ of the Joule heat E generated in the phase-change material at the time of the application of the word-line two-step pulse is always $\Delta E_{WL} < 0$. This is suitable for causing a temperature change from the nucleation temperature to the crystallization temperature lower than the nucleation temperature.

Consequently, when the two-step pulse is applied to the bit line BL or the word line WL, the voltage is changed from the first voltage to the second voltage in both cases, thereby decreasing Joule heat, and thus, the temperature at which the nucleation is most accelerated can be changed to a lower temperature at which the velocity of crystal growth is increased. However, according to the dependence of the resistance of the phase-change material PCR on the applied voltage, the possible range of changes in temperature differs. The range of changes in temperature should be at least larger than the temperature difference between the temperature most accelerating the nucleation velocity and the temperature most accelerating the crystal growth velocity. Therefore, corresponding to the dependence of the resistance of the phase-change material PCR on the applied voltage, one of the bit-line BL two-step pulse and the word-line WL two-step pulse that has a larger change in Joule heat is used. Consequently, the possibility that the temperature is controlled at a predetermined temperature is maximized. That is, when $\Delta E_{BL} > \Delta E_{WL}$, the method of applying the two-step pulse to the bit line is preferable, and when $\Delta E_{BL} < \Delta E_{WL}$, the method of applying the two-step pulse to the word line is preferable.

Third Embodiment

The memory cell circuit and the cross-sectional configuration according to a third embodiment are similar to those shown in FIGS. 4 to 15, and the descriptions thereof will be omitted.

A two-step pulse applied to the phase-change material according to the third embodiment is generated by applying a two-step voltage pulse to the word line WL, with a predetermined voltage being applied to the bit line BL. The voltage to be applied to the word line WL includes a first voltage $V_{WL1st}$ for word line WL and a second voltage $V_{WL2nd}$ for word line WL that is lower than first voltage $V_{WL1st}$. The first voltage $V_{WL1st}$ for word line WL is found from the relation among a drain current, a drain voltage, and a word voltage of the selective transistor TR so that a first voltage $V_{PCR1st}$ is appropriately applied to the phase-change material PCR. A time for the first voltage $V_{WL1st}$ for word line WL is made equal to the time for the first voltage $V_{PCR1st}$ that is desired. The second voltage $V_{WL2nd}$ for word line WL is found from the relation among the drain voltage, the drain current, and the word voltage of the selective transistor TR so that a second voltage $V_{PCR2nd}$ is appropriately applied to the phase-change material PCR. A time for the second voltage $V_{WL2nd}$ for word line WL is made equal to the time for the second voltage $V_{PCR2nd}$ applied to the phase-change material PCR.

A reason for applying the two-step pulse not directly to the bit line BL but to the word line WL is to suppress variations in drain current of the selection transistor TR, for example, a MISFET (Metal Insulator Semiconductor Field Effect Transistor).

A change of a load curve of the selective transistor TR when the two-step voltage is applied to the bit line BL is shown in FIG. 20. To the bit line BL, the first voltage $V_{BL1st}$ for bit line BL is applied, and then the voltage is changed to the second voltage $V_{BL2nd}$ for bit line BL. At this time, the voltage applied between the source and drain of the MISFET is decreased from the first voltage $V_{BDS1st}$ between the source and drain at the time of applying bit-line voltage to the second voltage $V_{BDS2nd}$ between the source and drain at the time of applying bit-line voltage. Also, the voltage applied to the phase-change material PCR is decreased. As a result, the drain current is shifted to a linear region, and variations in drain current with respect to variations in the bit-line BL voltage are increased. If the variation in drain current is decreased, the temperature of the phase-change material PCR is not sufficiently increased, thereby causing insufficient setting.

On the contrary, changes of the load curve of the selective transistor TR when the two-step voltage is applied to the word line WL is shown in FIG. 21. To the word line WL, the first voltage $V_{WL1st}$ for word line WL is applied, and then the voltage is changed to the second voltage $V_{WL2nd}$ for word line WL. At this time, the voltage applied between the source and drain of the MISFET is increased from the first voltage $V_{WDS1st}$ between the source and drain at the time of applying word-line voltage to the second voltage $V_{WDS2nd}$ between the source and drain at the time of applying word-line voltage. And, the voltage applied to the phase-change material PCR is decreased. As a result, the drain current is moved to a saturation region, and variations in drain current with respect to variations in the bit-line BL voltage are reduced. Further, a pulse of constant current is more preferable to be applied to the phase-change material than a pulse of constant voltage as a voltage. With the constant-voltage pulse, the resistance of the phase-change material PCR is decreased during the application of the set pulse. With the constant-voltage pulse, the current is rapidly increased and it results in a rapid increase in Joule heat, thereby causing the temperature of the phase-change material PCR to exceed the melting point. By contrast, with the constant-current pulse, a rapid increase in Joule heat does not occur. Details of this phenomenon will be described below.

When the constant current is applied to the word line WL, a constant current $I_0$ is applied between the upper electrode UE and the lower electrode PLUG. At this time, when a resistance between the upper electrode UE and the lower electrode PLUG at the start of set pulse application is $R_0$, and a voltage between the upper electrode UE and the lower electrode PLUG in a reset state is $V_0$, according to the Ohm's law, $$V_0 = R_0 \times I_0 \quad (1)$$

holds. Next, when a resistance between the upper electrode UE and the lower electrode PLUG at the end of applying the set pulse is $R_1$, $R_1 < R_0$ holds. This is because the resistance value is decreased due to the application of set pulse. And, when a voltage between the upper electrode UE and the lower electrode PLUG in a reset state is $V_1$, immediately before the end of applying the set pulse, from the Ohm's law, the following relation holds.

$$V_1 = R_1 \times I_0 \quad (2)$$

From the relation $R_1 < R_0$ and the above equations (1) and (2), it can be found that $V_1 < V_0$ holds. The set pulse is applied to the phase-change material PCR in a reset state, and the material is gradually changed to a low resistance state during the application of the set pulse. Therefore, the power consumption in the phase-change material PCR is changed from $V_0 I_0$ to $V_1 I_0$. From the voltage relation $V_1 < V_0$, it can be found that the magnitude relation of power consumption is $V_0 I_0 > V_1 I_0$. Since the power consumption in the phase-change material is proportional to generated Joule heat, Joule heat generated due to the application of the set pulse tends to be gradually decreased, and so there is no possibility of becoming a liquid-phase growth.

On the other hand, in the method of applying a constant voltage to the bit line BL, a constant voltage $V_2$ is applied between the upper electrode UE and the lower electrode PLUG. When a resistance between the upper electrode UE and the lower electrode PLUG at the start of applying the set pulse is $R_2$ and a voltage between the upper electrode UE and the lower electrode PLUG in a reset state is $V_2$, according to the Ohm's law, $$V_2 = R_2 \times I_2 \quad (3)$$

holds. Next, when a resistance between the upper electrode UE and the lower electrode PLUG at the end of applying the set pulse is R3, $R_2 > R_3$ holds. And, when a current between the upper electrode UE and the lower electrode PLUG in a reset state is $I_3$, in a set state, according to the Ohm's law, the following relation holds.

$$V_2 = R_3 \times I_3 \quad (4)$$

From the relation $R_3 < R_2$ and the equations (3) and (4), it can be found that $I_3 > I_2$ holds. The power consumed in the phase-change material is changed from $V_2 I_2$ to $V_2 I_3$ and, from the relation $I_3 > I_2$, a relation $V_2 I_2 < V_2 I_3$ holds. That is, when a constant voltage is applied to the bit line, Joule heat is increased during the application of the set pulse. Since an increase ratio of Joule heat $I_3/I_2$ is equal to $R_2/R_3$ and $R_2$ is ten times larger than $R_3$, it can be found that Joule heat is increased more than ten folds. As a result, there is a very high possibility that the temperature of the phase-change material PCR exceeds the crystallization temperature and liquid-phase growth occurs. Once the liquid-phase growth occurs, high-speed setting is impossible due to the following reason. That is, to perform setting at high speed, a current pulse is preferably applied to the phase-change material PCR, and one way to do this is to apply a voltage pulse to the word line WL.

Circuit diagrams achieving the two-step pulse for use in the present invention are shown in FIGS. 11 to 15. FIG. 15 shows the word-line driver WD that controls the word voltage. According to a first power voltage $V_1$ and a second power voltage $V_2$ applied to the word line WL, a word-line voltage VWL is controlled via PMOS transistors MP1 and the MP2, respectively. The gates of these PMOS transistors are connected to write enable signals $\phi_1$ and $\phi_2$, respectively. And, they are also drawn out to the ground potential from between the PMOS transistors and the word-line voltage VWL via an NMOS transistor MN. The gate of this NMOS transistor is coupled to a write enable signal $\phi_0$.

Changes in the write enable signals $\phi_1$, $\phi_2$ and $\phi_3$ when a two-step voltage is applied in two steps to the word line from a wait state are shown in FIG. 14. When a voltage of the first step is applied, the write enable signals $\phi_0$ and $\phi_1$ are changed from a high potential VDD to the ground potential VSS. Then, when a voltage of the second step is applied, the write enable signal $\phi_1$ is changed from the ground potential VSS to the high potential VDD, and the write enable signal $\phi_2$ is changed from the high potential VDD to the ground potential VSS. Lastly, when the application of the second-step voltage ends, the write enable signal $\phi_0$ is changed from the ground potential VSS to the high potential VDD, and the write enable signal $\phi_2$ is changed from the ground potential VSS to the high potential VDD.

Fourth Embodiment

Figure 22:
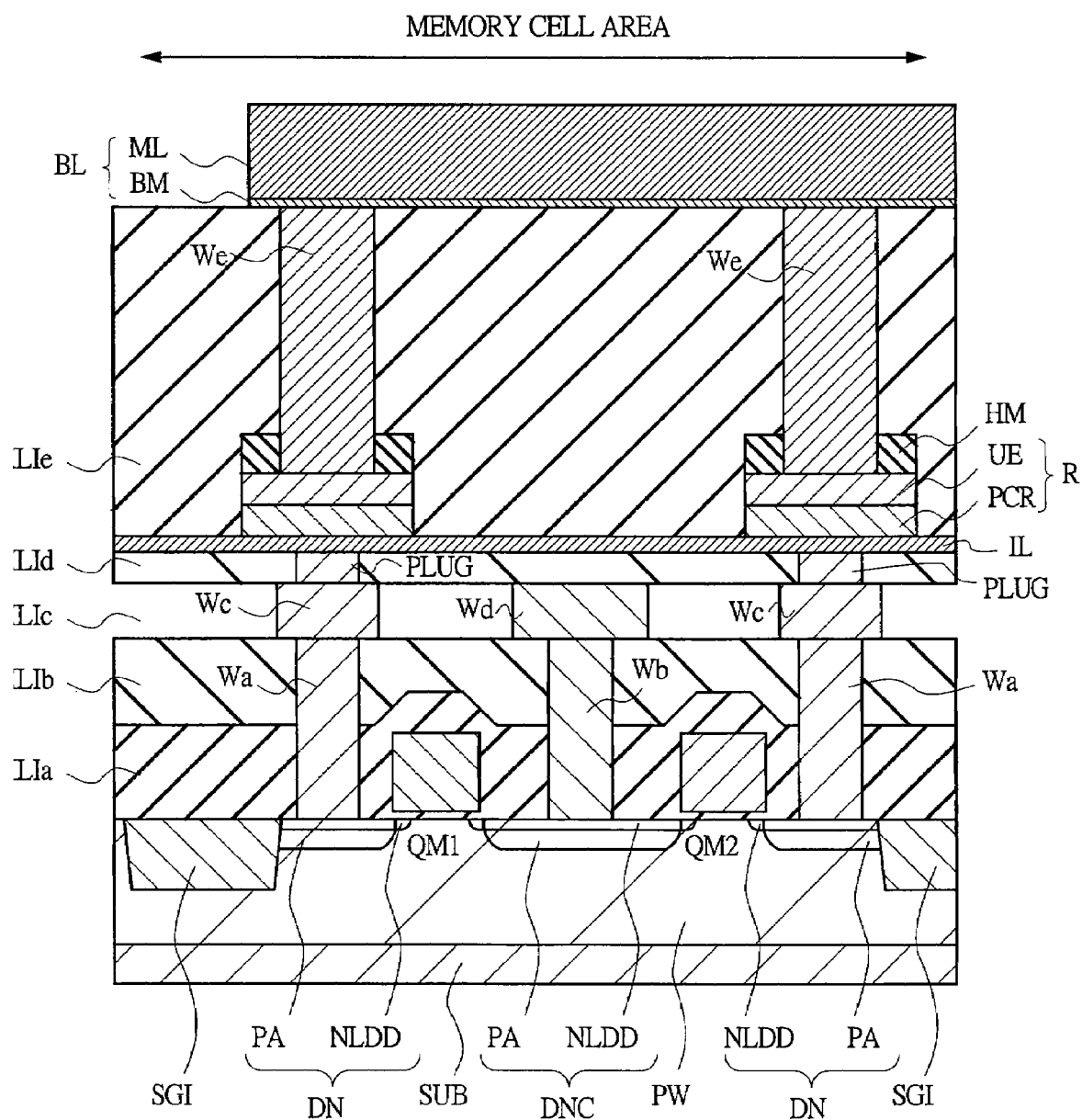
FIG. 22 is a cross-sectional view showing a structure near a phase-change material upon inserting an interface layer according to a fourth embodiment of the present invention.
Figure 23:
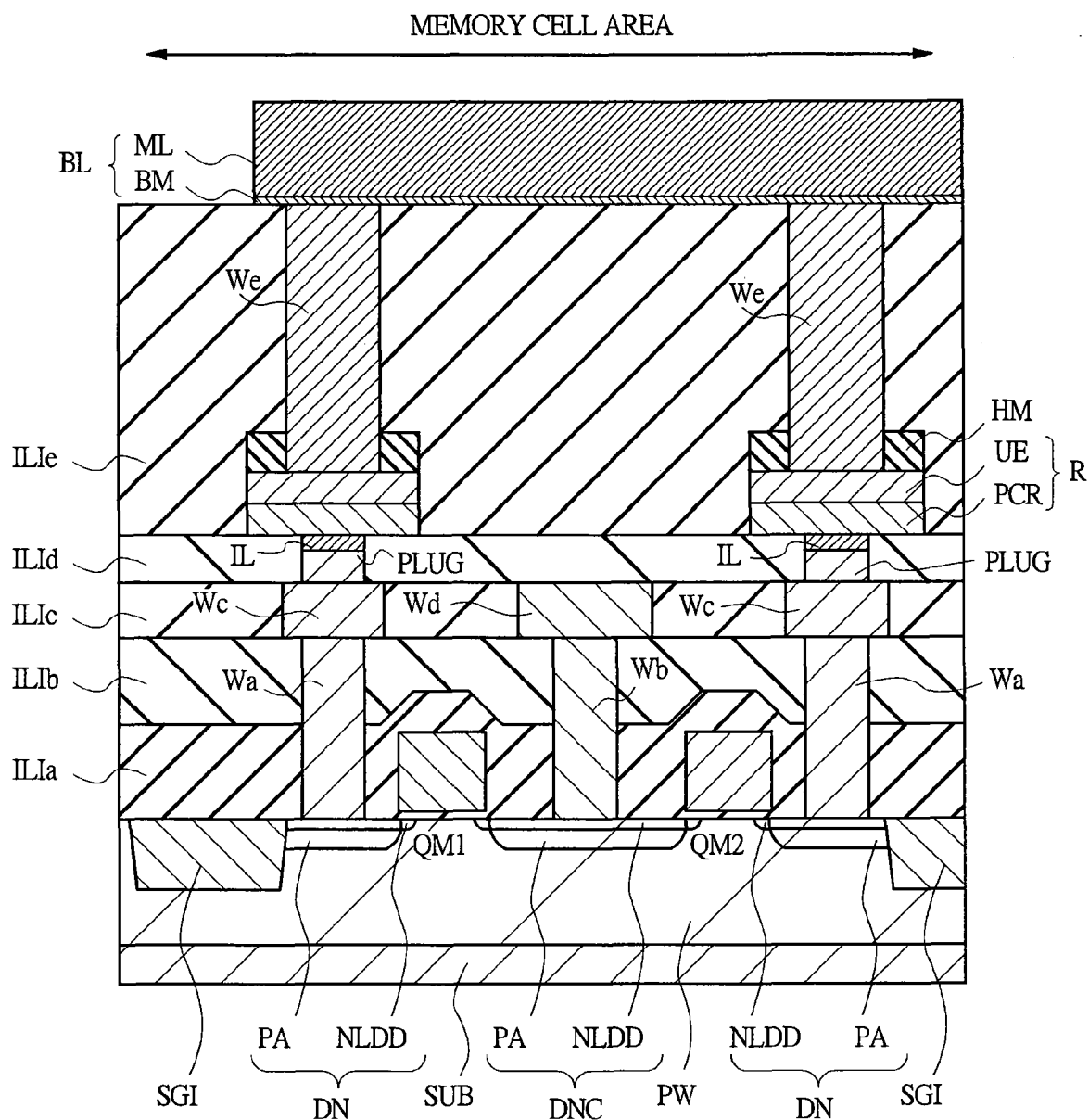
FIG. 23 is a cross-sectional view showing the structure near the phase-change material upon inserting the interface layer only onto a plug according to the fourth embodiment of the present invention.

FIGS. 22 and 23 are cross-sectional views showing configurations near the plug electrode of the phase-change memory cell according to a fourth embodiment of the present invention. FIG. 22 shows the case where an interface layer IL is formed on the entire upper surface of the interlayer insulating film ILId. FIG. 23 shows the case where the interface layer IL is formed only on the lower electrode plug PLUG.

The interface layer IL is a high-resistance film formed on the interlayer insulating film ILId and the lower electrode plug PLUG, and also on the lower electrode plug PLUG shown in FIG. 23.

A purpose for inserting the interface layer IL is to reduce rewrite voltage by increasing heat efficiency by reinforcing adhesiveness among an interlayer film INS and the lower electrode plug PLUG and the phase-change material PCR or by inserting a resistor. Examples of material for use for the interface layer IL include a Ti film, an Al film, a Ta film, a Si film, a TiN film, an AlN film, a TaN film, a WN film, a TiSi film, a TaSi film, a WSi film, a TiW film, a TiAlN film, a TaSiN film, a TiSiN film, and a WSiN film. Also, by using the fact that Te contained in the phase-change material PCR is easily reacted with Ti and Al, a compound of Ti and Te or a compound of Al and Te may be used as a conductive interface layer. Examples of insulating interface layer include a TiO film, an AlO film, a TaO film, an NbO film, a VO film, a CrO film, a WO film, a ZrO film, an HfO film, and a SiO film.

Figure 24A:
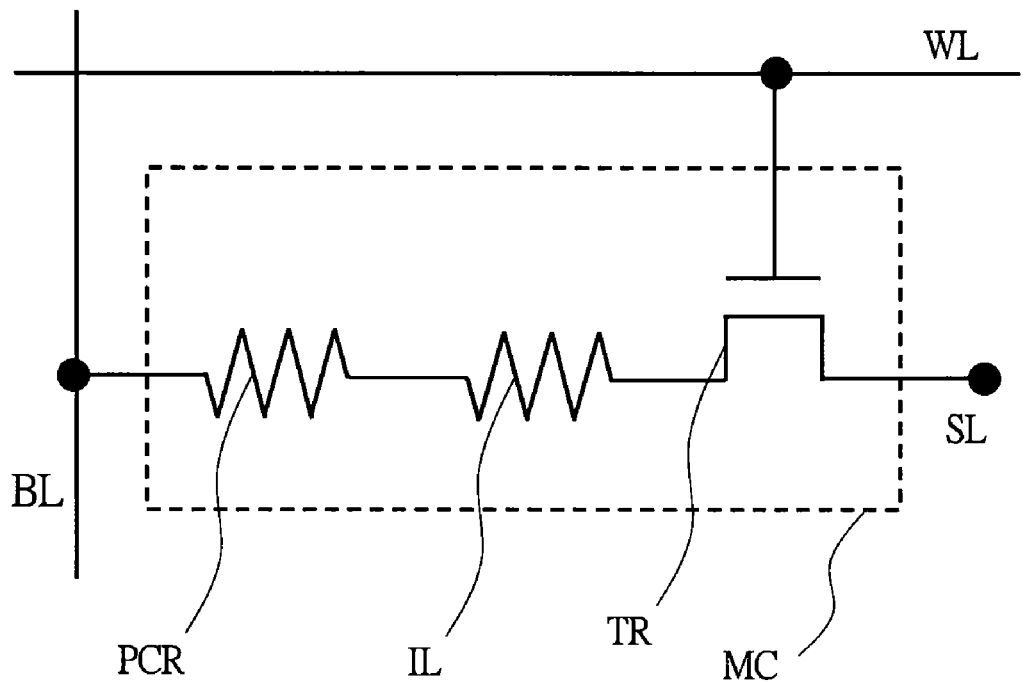
FIGS. 24A and 24B are circuit diagrams showing configurations of memory cells upon inserting the interface layer according to the fourth embodiment of the present invention.
Figure 24B:
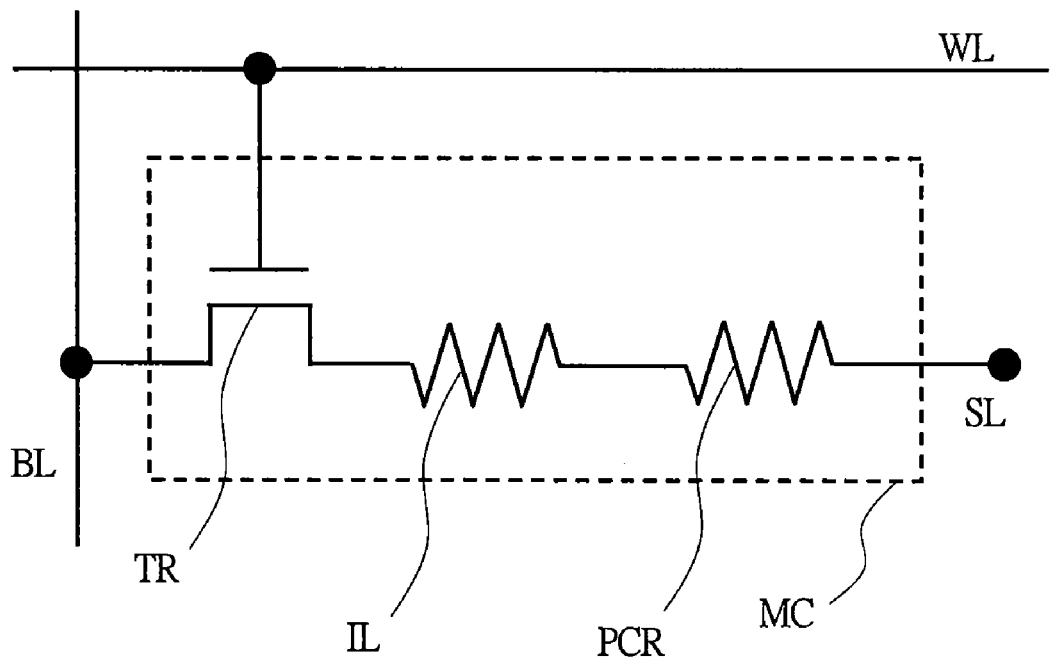

Circuit diagrams of the memory cell according to the fourth embodiment are shown in FIGS. 24A and 24B. For these, since a resistance of the interface layer depends on a voltage $V_{IL}$ applied to the interface layer, and is represented as $R_{IL}(V_{IL})$. When a voltage applied to the phase-change material is $V_{PCR}$, the resistance of the phase-change material PCR is represented as $R_{PCR}(V_{PCR})$. Thus, when a voltage applied between the upper electrode UE and the lower electrode plug PLUG is $V_{TOTAL}$, Joule heat $E_{TOTAL}$ generated in the phase-change material PCR and the interface layer when the interface layer IL is inserted is represented as $E_{TOTAL}=V_{TOTAL}^2/(R_{PCR}(V_{PCR})+R_{IL}(V_{IL}))$. Among $V_{TOTAL}$, $V_{PCR}$, and $V_{IL}$, a relation of $V_{TOTAL}=V_{PCR}+V_{IL}$ holds. Therefore, when $V_{TOTAL}$ is determined, $V_{TOTAL}$ is voltage-divided between $V_{PCR}$ and $V_{IL}$ by a ratio of $R_{PCR}$ and $R_{IL}$. When defining $R_{TOTAL}=R_{PCR}+R_{IL}$, since $R_{TOTAL}$ is a function of $V_{TOTAL}$, it can be represented as $R_{TOTAL}(V_{TOTAL})$. That is, it can be represented as $E_{TOTAL}=V_{TOTAL}^2/R_{TOTAL}(V_{TOTAL})$. Since $R_{PCR}$ and $R_{IL}$ are both non-ohmic, their total sum $R_{TOTAL}$ is also non-ohmic.

In the case where $R_{TOTAL}$ is decreased with respect to an increase of $V_{TOTAL}$, from the same principle as discussed in the second embodiment above, it can be determined which is more appropriate, applying the two-step pulse to the bit line BL or to the word line WL. Also, as described in the third embodiment, it is also correct applying the two-step pulse to the word line WL can reduce variations in drain current.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be used in manufacturing industries of semiconductor devices, electronic devices, and the like.

The invention claimed is:

1. A semiconductor device comprising a plurality of word lines, a plurality of bit lines, and memory cells provided at predetermined cross points of the plurality of word lines and the plurality of bit lines, the memory cell including a phase-change material and a selection element,
    wherein the semiconductor device has: a function to apply a voltage that is lower than a voltage amorphousizing the phase-change material of a reset operation, takes a shorter time to reach a crystallization temperature from a start of pulse application than a time of proceeding crystallization, and causes the phase-change material to eventually reach its melting point if maintain the voltage applied to the phase-change memory, thereby increasing a temperature of the phase-change material; and a function to stop application of the voltage before reaching the melting point, thereby cooling the phase-change material, in a set operation for crystallizing the phase-change material.

2. The semiconductor device according to claim 1, wherein the selection element is a MIS transistor.

3. The semiconductor device according to claim 1, wherein the selection element is a bipolar transistor.

4. The semiconductor device according to claim 1, wherein the phase-change material contains at least Te.

5. A semiconductor device comprising a plurality of word lines, a plurality of bit lines, and memory cells provided at predetermined cross points of the plurality of word lines and the plurality of bit lines, the memory cell including a phase-change material and a selection element,
    wherein, the semiconductor device has a function to apply a first voltage to the phase-change material, thereby increasing a temperature of the phase-change material to a temperature lower than a melting point; and a function to apply a second voltage that is lower than the first voltage and applied for a shorter application time than an application time of the first voltage to the phase-change material, thereby changing the temperature of the phase-change material to a temperature lower than the temperature reached by the first voltage application, in a set operation for crystallizing the phase-change material.

6. The semiconductor device according to claim 5,
wherein the change from the first voltage to the second voltage is controlled by a change of a voltage applied to the word line.

7. The semiconductor device according to claim 5,
wherein the change from the first voltage to the second voltage is controlled by a change of a voltage applied to the bit line.

8. The semiconductor device according to claim 5,
wherein the temperature of the phase-change material reached by the application of the first voltage is substantially identical to a temperature at which a nucleation velocity becomes maximum.

9. The semiconductor device according to claim 5,
wherein the temperature of the phase-change material reached by the application of the second voltage is substantially identical to a temperature at which a crystal growth velocity becomes maximum.

10. The semiconductor device according to claim 5,
wherein the selection element is a MIS transistor.

11. The semiconductor device according to claim 5,
wherein the selection element is a bipolar transistor.

12. The semiconductor device according to claim 5,
wherein the phase-change material contains at least Te.

13. A semiconductor device comprising:
a plurality of word lines;
a plurality of bit lines crossing the plurality of word lines;
a plurality of memory cells provided at cross points of the plurality of word lines and the plurality of bit lines; and
a control circuit that controls a write pulse to the plurality of memory cells,
wherein the control circuit includes a first shot-pulse generation circuit that outputs a first control signal and a second shot-pulse generation circuit that outputs a second control signal, and
wherein, when writing is performed on any of the plurality of memory cells, the first shot-pulse generation circuit causes a transition of a potential of the first control signal to a selection level to change a potential of the write pulse to a first selection level, and then the second shot-pulse generation circuit causes a transition of a potential of the second control signal to a selection level to change the potential of the write pulse from the first selection level to a second selection level.

14. The semiconductor device according to claim 13, further comprising a plurality of drivers that supply the write pulse to the plurality of memory cells,
wherein each of the plurality of drivers includes a first MOS transistor having a source and a drain between a first potential corresponding to the first selection level and an output node that outputs the write pulse, and a second MOS transistor having a source and a drain between a second potential corresponding to the second selection level and the output node, and
the first control signal is inputted to a gate of the first MOS transistor, and the second control signal is inputted a gate of the second MOS transistor.

15. The semiconductor device according to claim 14,
wherein the second potential is higher than the first potential.

16. The semiconductor device according to claim 14,
wherein a transition period of the first control signal from the selection level to a non-selection level and a transition period of the second control signal from the selection level to a non-selection level overlap each other.

17. The semiconductor device according to claim 14,
wherein the control circuit outputs a third control signal for causing the write pulse to be at a non-selection level,
each of the plurality of drivers further includes a third MOS transistor having a source and a drain between a third potential corresponding to the non-selection level and the output node, and
the third control signal is inputted to a gate of the third MOS transistor.

18. The semiconductor device according to claim 14,
wherein the output node is connected to a corresponding one of the plurality of word lines.

19. The semiconductor device according to claim 13,
wherein each of the plurality of memory cells has a phase-change resistor.

* * * * *